United States Patent [19]

Pixley

[11] Patent Number: 5,331,568
[45] Date of Patent: Jul. 19, 1994

[54] APPARATUS AND METHOD FOR DETERMINING SEQUENTIAL HARDWARE EQUIVALENCE

[75] Inventor: Carl Pixley, Austin, Tex.

[73] Assignee: Microelectronics & Computer Technology Corporation, Austin, Tex.

[21] Appl. No.: 717,213

[22] Filed: Jun. 18, 1991

[51] Int. Cl.$^5$ .............................................. G06F 15/60
[52] U.S. Cl. ...................................... 364/489; 364/488
[58] Field of Search ................. 364/488, 489, 490, 491

[56] References Cited

U.S. PATENT DOCUMENTS

| | | | |
|---|---|---|---|
| 4,942,536 | 7/1990 | Watanabe et al. | 364/490 |
| 5,065,335 | 11/1991 | Yokota et al. | 364/489 |
| 5,067,091 | 11/1991 | Nakagawa | 364/488 |
| 5,164,908 | 11/1992 | Igarashi | 364/491 |

OTHER PUBLICATIONS

"Drafting of Logical Circuit Diagram by Utilizing Signal Probability" by Nagai et al., 31st National Conference (Second Half of 1985) of the Information Processing Society of Japan, pp. 1557-1558.
"Binary Decision Diagrams" by S. B. Akers, IEEE Transactions on Computers, vol. C-27, No. 6, Jun. 1978, pp. 509-516.

*Primary Examiner*—Vincent N. Trans
*Attorney, Agent, or Firm*—Ross, Howison, Clapp & Korn

[57] ABSTRACT

A method for determining sequential hardware equivalence between two designs and whether one design can replace another design is disclosed whereby the designs are compared utilizing OBDD representations of the designs. The set of states in each of the designs that are equivalent to each other, equivalent-state-pairs, is first determined and it is then determined whether there exists a sequence of inputs that can take all states pairs to the equivalent-state-pair set. This results in a declaration of equivalence in the two designs. An essential reset sequence is then determined, which is then represented by the sequence of inputs to move the designs to a reset state. This, therefore, gives an essential reset sequence for the design and also gives the essential reset states for the design. The essential reset states of the design can then be compared to all states of the designs and, if they are equal, the design is replaceable.

15 Claims, 5 Drawing Sheets

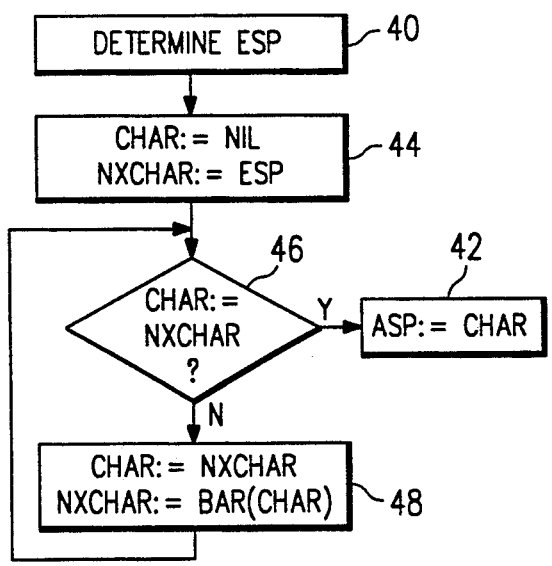
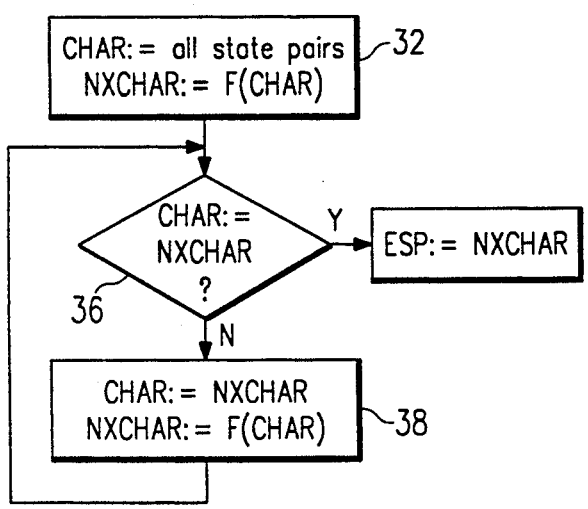
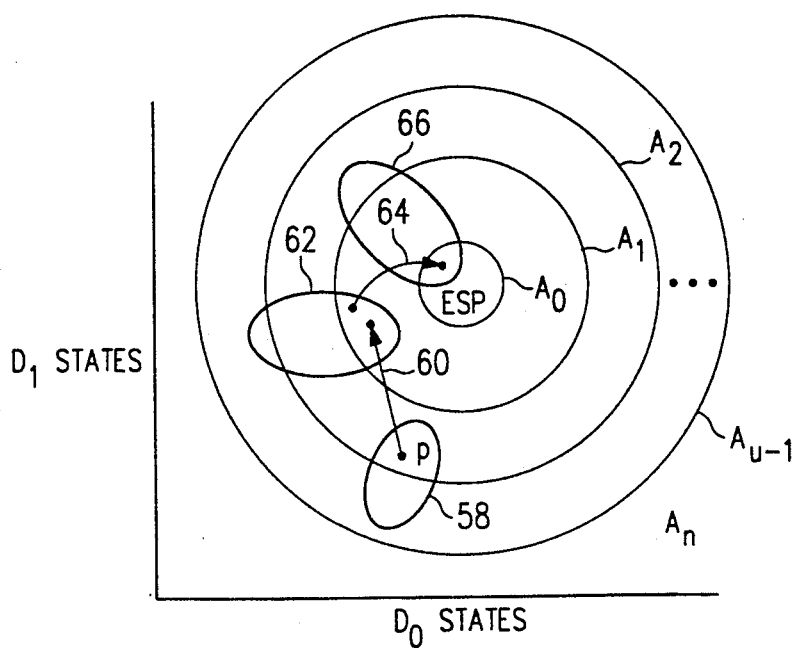

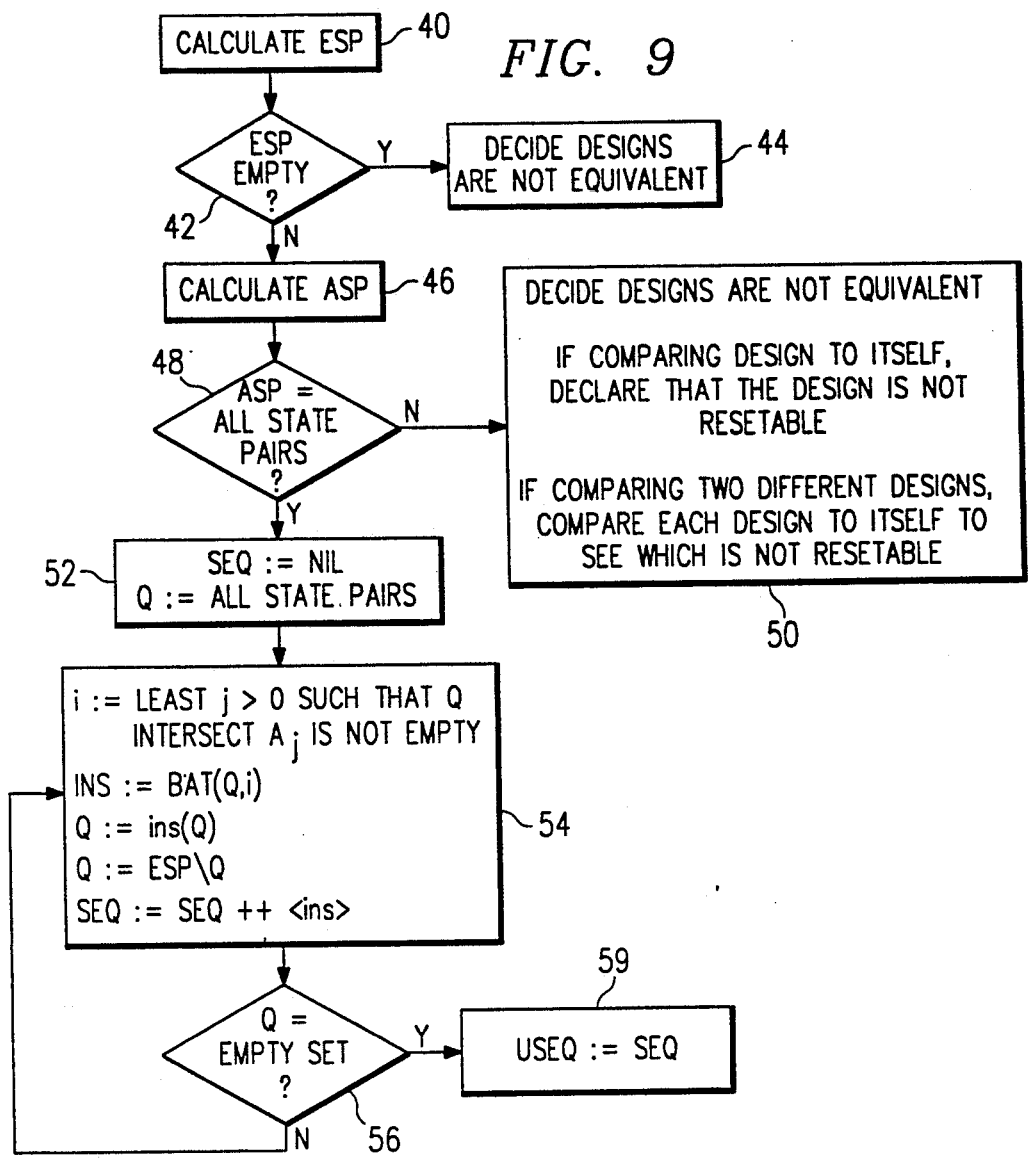

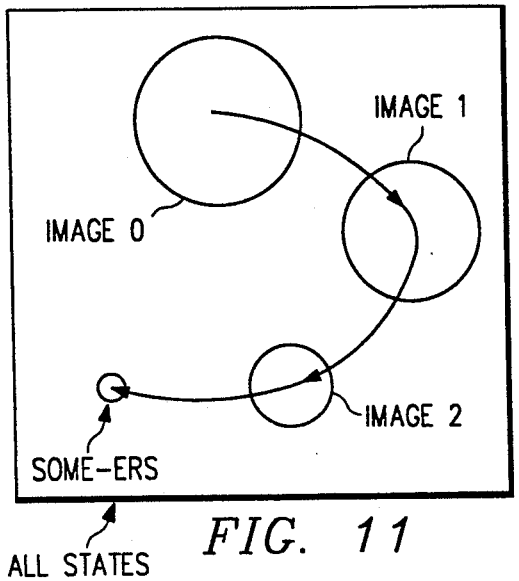
FIG. 11
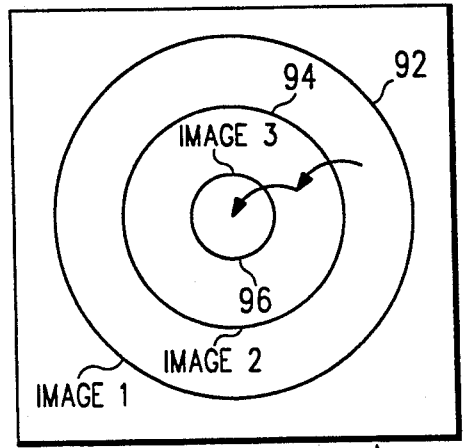
FIG. 14
FIG. 13
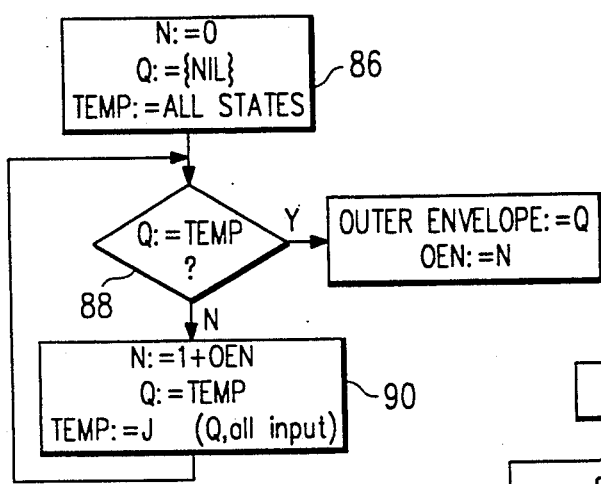
FIG. 12
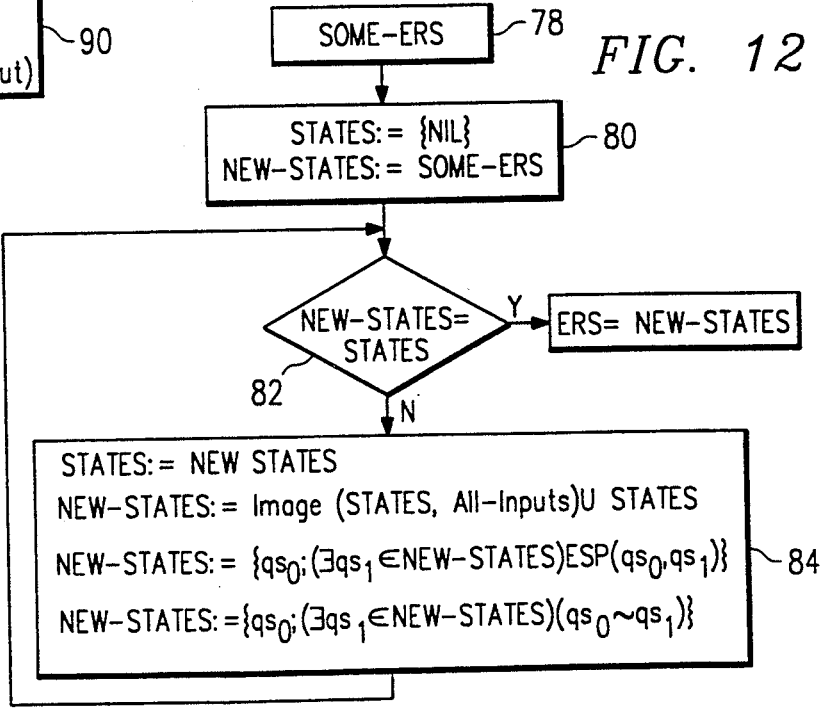

APPARATUS AND METHOD FOR DETERMINING SEQUENTIAL HARDWARE EQUIVALENCE

TECHNICAL FIELD OF THE INVENTION

The present invention pertains in general to a system for determining the equivalence between two hardware designs, and more particularly, to a system that utilizes algorithms based upon a ordered binary decision diagrams (OBDD) implementation of predicate calculus over boolean domains to make this determination.

BACKGROUND OF THE INVENTION

Sequential machines present unique problems to providing reliable designs. Often original sequential machine is reimplemented in a new fabrication technology or reimplemented within a given fabrication technology, In practice, the new sequential design must be checked against the original, whether the new design is implemented by hand or through the use of a synthesis tool. This area of comparison is referred to as "design verification". Present design verification techniques are inadequate to check for functional equivalence, since they utilize a partial simulation of the sequential behavior of a new design by itself or in its intended environment.

Synchronous designs generally are modeled at the gate level in terms of combinational elements and Primitive Storage Elements (PSEs). APSE is a device that shifts its input to its output on a clock event and holds its value until the next clock event. An example of a primitive storage element is a simple D-flip-flop (without enable or reset). Most real storage devices, such as D-flip-flops with an enable, reset, and both Q and $\overline{Q}$ outputs. can be modeled as a network of these primitive storage elements together with combinational logic. However, one of the limiting factors of all state machines utilized in, for example digital computers, is the length of time required for signals to propagate through all of the logic gates between PSEs. Therefore, an original design is often modified to shorten the length of the signal propagation time.

There are three important areas in design verification. These are formal verification, synthesis, and Automatic Test Pattern Generation (ATPG), With respect to ATPG, a machine is designed so that when the machine is actually fabricated, it can be tested to determine whether the fabricated system is equivalent to a flawlessly fabricated design. With respect to synthesis, design verification is required to show that a resynthesized design is equivalent to an original design or that a synthesized design conforms to its specification. In synthesizing a design, a designer can provide the storage elements and logic equations relating storage elements to each other and to the inputs and outputs of the design. Then a synthesis machine is allowed to generate a design from this information. The third, formal verification, allows a designer to determine not only if his design is equivalent to another known design, but also if his design is equivalent to itself.

SUMMARY OF THE INVENTION

A method for comparing sequential hardware designs comprises first providing a first and second compatible designs. The first design is then compared to the second design as a second design pair, and a representation of the total sequential behavior of the design pair is provided. From this representation, the set of state pairs within the design pair is determined, that for any sequence of inputs to the design pair will result in the outputs of the first and second design, designs being equivalent for all state pairs reached by the same inputs with the sequence. After the equivalent-state-pair set is determined, it is then determined whether any state of the design pairs are included within the equivalent-state-pair set.

In another aspect of the present invention, if the equivalent-state-pair set is not empty, then the set of state pairs that can be transformed into the equivalent-state-pair set in less than a predetermined number of cycles is determined as the alignable-pair set. It is then determined whether the set of alignable-pairs is equal to the set of all state pairs for the design pair. If so, the first and second designs are declared to be equivalent. If not, one of the first and second designs is declared as not being resettable.

In a further aspect of the present invention, an aligning sequence is determined, which is comprised of a set of input vectors that, when applied to all state pairs of the design pair results in all the state pairs being transferred into the equivalent-state-pair set.

BRIEF DESCRIPTION OF THE DRAWINGS

For a more complete understanding of the present invention and the advantages thereof, reference is now made to the following description taken in conjunction with the accompanying Drawings in which:

FIG: 1 illustrates a representation of a design which includes four inputs, three storage elements, and two outputs;

FIG. 6 illustrates a flowchart for determining the ESP;

FIG. 7 illustrates a flowchart for calculating the ASP;

FIG. 8 illustrates a graph of the states of $D_0$ and $D_1$, illustrating a plurality of sets used in the calculation of a universal aligning sequence.

FIG. 9 illustrates a flowchart for determining the Universal Aligning Sequence;

FIG. 10 illustrates a flowchart for calculating a nonempty set of essential reset states;

FIG. 11 illustrates each set of states converging to a set of essential reset states;

FIG. 12 illustrates the program for computing all essential reset states;

FIG. 13 illustrates the flowchart for calculation of the outer envelope;

FIG. 14 illustrates a sequence of sets converging to the outer-envelope; and

DETAILED DESCRIPTION OF THE INVENTION

Figure 1:
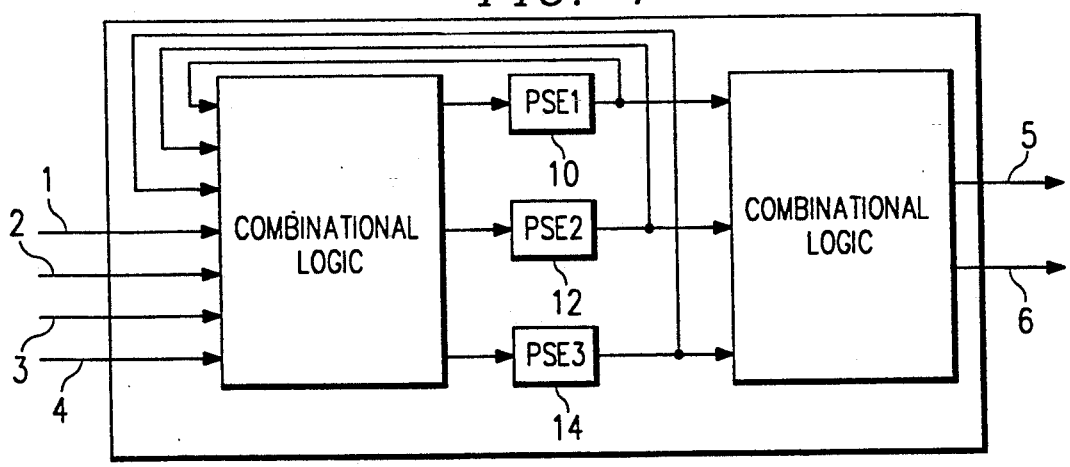

Referring now to FIG. 1, there is illustrated a representation of a design which includes four inputs 1, 2, 3, 4; three storage elements 10, 12 and 14, which are labeled PSE1, PSE2 and PSE3; and two outputs 5 and 6. Each design has a set of inputs, a set of storage elements, and a set of outputs. A synchronous hardware design is defined as the interconnection of inputs, purely combinational elements, primitive storage devices, and outputs. Each interconnection (i.e., net) is required to have exactly one driver (design input or output of a combinatorial or storage device) and every loop of nets must be broken by at least on storage element. The list of interconnections (netlist) combined with the device models defines the design.

Each design is associated with a set of boolean logic variables representing inputs ins, a set of current states qs, and a set of next-states nxqs. A predicate (i.e., a boolean valued function of several boolean value variables), called the "transition" relationship is denoted as follows:

$$\text{transition}(qs, ins, nxqs) \tag{1}$$

Function (1) has a value of "1", if and only if when the inputs have values ins and the current values of the storage elements are qs, then the values of the storage elements are nxqs after one clock event. The predicate, transition, is an encoding of the state transition graph of the design. As will be described hereinbelow, Ordered Binary Decision Diagrams (OBDD) are utilized to provide an efficient way to represent and calculate these predicates. The importance of these OBDDs is that the size of the OBDD representation of the transition is not related to the size of the state transition graph. Furthermore, the size of the transition relation is typically much smaller than the number of states in the state transition graph. The design output functions play no role in the definition of transition.

Figure 2:
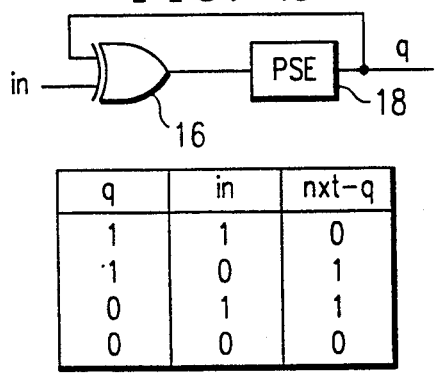
FIG. 2 illustrates an example of the transition relation.

Referring now to FIG. 2, there is illustrated an example of the transition predicate. The design is represented by a single Exclusive OR gate (XOR) 16 that has the output thereof connected to the input of a storage element 18. The output of the storage element 18 is q, wherein one input of the XOR gate 16 is in. The other input of the XOR gate 16 is connected to the output of the storage element 18. A table is provided that illustrates the vectors of boolean variables, q, in, and nxq. In this illustration, each of ins, qs, and nxqs consist of only one boolean variable, in, q, and nxq. It can be seen that for a q state of "1" and an in of "1", the nxq will have a state of "0". For a q of "1" and an in of "0", the nxq will be a "1". For a q of "0" and an in of "1", the nxqs will be "1". For a "0" on both in and q, the nxtq will be a "0". The transition relationship for this design will be as follows:

$$\text{transition}(qs, ins, nxqs) = in\&(q \text{ xor } nxq) \lor \neg in(q \text{ xor } nxq) \tag{2}$$

Transition relationships are generally described in Appendix A.

EQUIVALENT-OUTPUTS AND EQUIVALENT-STATE-PAIRS

Figure 3:
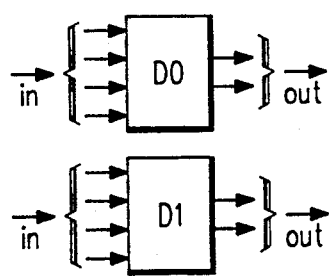
FIG. 3 illustrates two designs that are to be tested for their functional equivalence.

Referring now to FIG. 3, there are illustrated two designs $D_0$ and $D_1$ that are to be tested for their functional equivalence. It is noted that for two designs to be equivalent, they must be compatible designs, i.e., have the same inputs, ins, and the same outputs, outs. The boolean variables, $qs_0$ and $qs_1$ are provided that represent the values of the storage devices in the two designs $D_0$ and $D_1$. A predicate Equivalent-Outputs($qs_0$, $qs_1$) is defined which is true if and only if for each pair of corresponding outputs,($out_0$, $out_1$), that the following is true for all inputs, ins:

$$out_0(ins, qs_0) = out_1(ins, qs_1) \tag{3}$$

Figure 4:
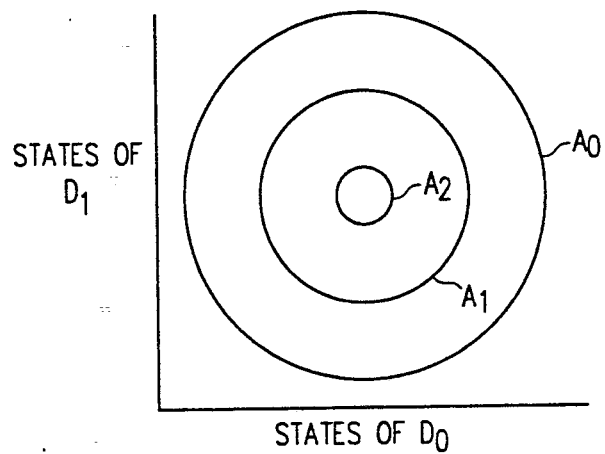
FIG. 4 illustrates a graph of the states of design $D_0$ versus the states of design $D_1$ and three sets of state pairs illustrating the calculation of the set of equivalent state pairs.

A pair of states ($qs_0$, $qs_1$) is defined as "equivalent" ($\sim$), if and only for each pair of states, ($qs_0'$, $qs_1'$), that are reachable from the pair of states ($qs_0$, $qs_1$) by any finite sequence of inputs (the same for both designs $D_0$ and $D_1$), Equivalent-Outputs($qs_0$, $qs_1$)=1. Therefore, states $qs_0$ and $qs_1$ are equivalent (i.e., $qs_0 \sim qs_1$) if and only if whenever design $D_0$ is initialized to state $qs_0$ and $D_1$ is initialized to $qs_1$, the designs will produce the same outputs for any finite sequence, no matter how long, of identical inputs. Therefore, if the designs are initialized to a pair of equivalent states, then the input/output behaviors of the two designs are indistinguishable. With reference to FIG. 4, there is illustrated a graph representing the state pairs of design $D_0$ versus the state of design $D_1$. A subset, $A_0$, of all of the state pairs of design $D_0$ and $D_1$ is defined as the state pairs having equivalent outputs, regardless of the input that is given to it. The set, $A_1$, represents the state pairs that are reachable within one clock cycle from state pairs in $A_0$ and still have equivalent outputs. Further $A_2$ is a subset of $A_1$ that represents state pairs that have equivalent outputs initially and their outputs are equivalent after one cycle and their outputs are equivalent output after two cycles, no matter which sequence of two input vectors are given ( the same for each design). It can be seen that the set is the same or smaller for each clock cycle. However, there is a limit, and this is an important aspect of the invention. This limit is the set of states such that for the next clock cycle the set will be the same set. This set of states is called the "(ESP)" wherein the predicate Equivalent-State-Pairs($qs_0$, $qs_1$) as a value of "1", if and only if ($qs_0$, $qs_1$) is an equivalent pair, i.e., $qs_0 \sim qs_1$. The algorithm for computing the equivalent-state-pairs will be described hereinbelow. However, the equivalent-state-pairs has a value that is false for all state pairs, i.e., the value is "0", when there exists no pair of equivalent states. (Once one has determined what the Equivalent-State-Pairs are, it is then straightforward to decide whether the design $D_0$ if initialized to $qs_0$, will have the same output behavior as the design $D_1$, initialized to $qs_1$ for all possible sequences of valid inputs starting from states ($qs_0$, $qs_1$). Therefore, the ESP represents the set of all state pairs that provide indistinguishable outputs for all clock cycles thereafter.

Initialization and Alignability

Correct operation of sequential hardware is dependent upon the ability to return to a predictable state from an arbitrary state. A state "S" is defined to be a "reset state", if there is some sequence of inputs (called a homing or reset sequence) that will transform an arbitrary state into the reset state S. Quite often, hardware is designed to have a short reset sequence that will drive the design into a specific reset state. If the designer knows the reset sequence for an original design, he or she may use the same reset sequence on the set of all pairs of states (of the original design and its replacement) to discover if the set of resulting pairs is a subset of the ESP. If so, the same reset sequence for the original design resets the new design as well. If not, there is some pair of states ($qs_0$, $qs_1$), such that the reset sequence will result in a pair of states that are not equivalent.

In many cases, in which a part of a larger design is being replaced, a designer may not know a reset sequence for the part of the original design. Given that ESP is not the empty set (i.e., there exists some pair of equivalent states), it is desirable to determine how to get from an arbitrary initial pair of states to an equivalent pair of states (ESP); that is, what sequence of inputs will force the replacement design to behave like the original?

A state pair ($qs_0$, $qs_1$) is "alignable" if and only if there is some sequence of inputs to the two designs such that when applied to the state pair ($qs_0$, $qs_1$), the resulting state is in the ESP. The set of alignable-state-pairs is denoted ASP and the predicate which is alignable-state-pairs($qs_0$, $qs_1$) is defined such that alignable-state-pairs has value "1" if and only if every pair of states is alignable.

Figure 5:
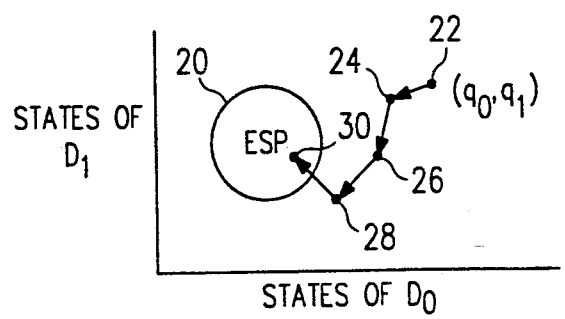
FIG. 5 illustrates a state diagram comparing the states of $D_0$ to the states of $D_1$ and illustrates the alignment of a state pairs $(q_0, Q_1)$

With reference to FIG. 5, there is illustrated a state diagram that represents the states of $D_0$ and of $D_1$ and that shows the set of equivalent-state-pairs in a boundary 20. Every pair within the boundary of 20 is an equivalent-state-pair and, therefore, any input sequence submitted to the pair of designs in that pair of states will result in the same output sequence of the two designs. However, outside of the boundary 20, this is not true. If the alignable-state-pairs consists of all state pairs of two designs, it will be shown that there is a "single" sequence, called a universal aligning sequence, of inputs that will align all pairs of states. For example, suppose that SEQ is a universal aligning sequence consisting of a sequence of four inputs. Therefore, for any state pair, say ($qs_0$, $qs_1$) illustrated by node 22, the first input vector of SEQ will change the state pair to a state pair at node 24 and the second input vector of SEQ will change 24 to the state pair at a node 26 and the third input will change 26 to the state pair at node 28 and the fourth input in SEQ will change 28 to the state pair at node 30, which node 30 corresponds to a state pair that is within the boundary 20, and therefore, constitutes an equivalent-state-pair. It can be shown that once a state pair is within the boundary 20, then any input will cause the pair to always change to a pair within the boundary 20.

Therefore, once it has been determined that ASP has value "1", design equivalence is assured and the designs are determined to be "strongly equivalent" or just "equivalent" ($\approx$) as designs. Strong-equivalence is asserted to be an equivalence relation on the set of all hardware designs that are strongly equivalent to themselves.

In order to find the equivalent states, it is first necessary to start with the two designs and the associated circuits. All the storage elements are located and the inputs and outputs are located. The designs, of course, must be compatible, that is, they must be a correspondence between their respective inputs and outputs. Boolean variables are declared for the inputs ins, the current state variables qs (one for each output of a PSE), and next-state variables nxq (one for each current state variable).

For each circuit output and storage element input, an OBDD representation of the boolean function is calculated in terms of the inputs and current state variables as specified by the netlist and device models comprising the circuit. The set of equivalent-output-pairs (EOP) is then defined in terms of current state variables qs of the design. The OBDD representation of the characteristic function of the transition relationship for each of the designs is then calculated. The conjunction of the transition relationships for each of the designs is then calculated and then the set of equivalent-state-pairs is determined. If the predicate equivalent-state-pairs has value "0", then the designs are declared to not be equivalent.

However, if the predicate equivalent-state-pairs is not "0", then there is at least one pair of equivalent states of the two designs. If that is the case, then the alignable-state-pairs is then determined. It is the determination of the alignable-state-pairs that allows one to decide the design equivalence. If not all state pairs are alignable, then one of the designs is not essentially resetable (as will be described hereinbelow) therefore, each of the designs must be checked to determine resetability. This would require each design to be compared to itself to determine if the design itself is resettable, which will be described hereinbelow.

As described above, for any design, the boolean variables, ins, are associated with the inputs to the design. In addition, the boolean variables qs and nxqs are associated to the current states and next-states, respectively, of the storage elements of the design. It is only necessary to compute the predicates, transition, equivalent-state-pairs, and alignable-state-pairs. The Ordered Binary Decision Diagram (OBDD), as described hereinabove, for any combination of logic functions is described in R. E. Bryant, "Graph-Based Algorithms for Boolean Function Manipulation", IEEE Transactions on Computers, Vol. C35, No. 8, August 1986, and J. P. Billon, J. C. Madre, "Original Concepts of Priam, An Industrial Tool for Efficient Formal Verification of Combinational Circuits," IFIP Conference on the Fusion of Hardware Design and Verification, Jul. 3–6, 1988, pp. 481–495, both of which references are incorporated herein by reference.

Calculation of Transition and Equivalent-Outputs

The transition predicate is derived from a netlist for a design $D_i$, and let $PSEs_i$ be the set of storage elements. Let ins, $qs_i$, and $nxqs_i$ be the input, state and next-state variables. For each PSE, qs, the input to qs is expressed as a boolean function, fun-q of variables, qs and ins. The function fun-q of is derived directly from the net list and logical device models as follows:

$$\text{transition}_i(qs, \text{ins}, nxqs) = \prod_{q \in PSEs_i} (nxq = \text{fun-}q) \quad (4)$$

Then, transition(ins, qs, nxqs) for a compatible pair D and $D_1$ is just the relation transition$_0$&transition$_1$. For corresponding outputs, $Out0_k$ and $Out1_k$ of the two designs, the output is expressed as a function $Out0\text{-fun}_k(\text{ins}, qs_0)$ and $Out1\text{-fun}_k(\text{ins}, qs_1)$ of the inputs and the q-values, with n being the number of outputs of two compatible designs. The Equivalent-Output-Pairs(EOP) represents the state pairs ($qs_0$, $qs_1$), having the same output functions as follows:

$$EOP(qs_0, qs_1) = (\forall ins) \prod_{s=1}^{n} (out0_s(ins, qs_0) = out1_s(ins, qs_1)) \quad (5)$$

Calculating the Equivalent-State-Pairs

Initially, let $A_0$ be the set of state-pairs $(qs_0, qs_1)$ for which EOP is a bdd equal to "1", i.e., states for which corresponding outputs of the two machines agree. In general, let the state-pair $(qs_0, qs_1)$ belong to $A_{i+1}$, if and only if $EOP(qs_0, qs_1)$ is equal to "1", and the set of all states reachable in one clock cycle from $(qs_0, qs_1)$ are in the set $A_i$. A simple induction argument shows that a state-pair, $(qs_0, qs_1)$, belongs to $A_i$, if and only if $EOP(qs_0, qs_1)$ is equal to "1", and for any sequence of input vectors, $in_i, in_{i-1} \ldots, in_1$, having length i, all state-pairs reached by that set of inputs satisfies EOP.

A function F is be defined for any set of State-Pairs Q as follows:

$$F(Q) = EOP \& (\equiv nxqs \in Q)(\forall ins) transition(ins, qs, nxqs) \quad (6)$$

Then, F(all-pairs) is EOP. Furthermore, the state pair p is in $F^n$(all pairs) if and only if p is in EOP and all state pairs reachable from p is in $F^{n-1}$(all pairs). Therefore, a simple induction argument would establish that a state pair p is in $F^n$(all pairs) if and only if the p, and for any sequence, SEQ, of n−1 or fewer input vectors, the state pairs reached by applying initial subsequences of SEQ to p are in EOP. Therefore, the Equivalent-State-Pairs is the largest fixed point of F, that is, ESP is equal to the limit as n goes to infinity of $F^n$(allpairs).

Referring now to FIG. 6, there is illustrated a flowchart for determining the ESP. Initially, a program variable (not a boolean variable) CHAR is defined in a block 32 that is assigned as being all state pairs. Another program variable NXCHAR is assigned as being F(CHAR). [CHAR and NXCHAR are program variables that represent the characteristic function and the next characteristic function, respectively.] The program then flows to a decision block 36 to determine if CHAR is equal to NXCHAR. If so, this means that NXCHAR is equal to the equivalent-state-pairs (ESP). If not, the program flows to a function block 38 to assign CHAR to the value of NXCHAR after which NXCHAR is then assigned the value F(CHAR). The output of function block 38 goes back to the input of decision block 36 and the loop continues until CHAR is equal to NXCHAR or, rather, both predicates are equal. It can be seen from the flowchart of FIG. 6 that the operation is essentially as described with respect to the diagram of FIG. 4, wherein each loop through the flowchart will result in going from the sets $A_0$ to $A_1$ to $A_2$, etc., until a set of states is found wherein the qs are equivalent to the nxqs. By setting the CHAR to NXCHAR and then NXCHAR to F(CHAR), this moves from one of the outermost boundaries to the next innermost boundary corresponding to one clock cycle. It is claimed that the calculation will terminate and that ESP is the final value of NXCHAR.

Calculation of Alignable-State-Pairs

In calculating the alignable-state-pairs (ASP), the supposition would be that the set of equivalent-state-pairs is non-empty, i.e., the predicate, equivalent-state-pairs is not "0", that is, False for all state pairs. There is a function BAR is defined for any set of state pairs Q. The state pairs BAR(Q) is the set Q together with all state pairs that can be forced into Q by some input vector in one clock cycle. The function BAR is used to calculate the set of alignable state pairs. The function BAR is as follows:

$$BAR(Q) = \{qs; Q \lor (\exists ins)(\exists \cdot nxqs \in Q) transition(ins, qs, nxqs) \quad (7)$$

The function BAR(Q) is used to define the set of state pairs for which there is a path into the ESP, knowing the ESP. Since $BAR(Q) \supseteq Q$, the sequence ESP, BAR(ESP), $BAR^2$(ESP), ... is an increasing sequence of sets. The set of alignable-state-pairs is defined to the limit as n goes to infinity of $BAR^n$(ESP).

Referring now to FIG. 7, there is illustrated a flowchart for calculating the ASP. First, the ESP is determined, as indicated by a block 40, which represents a flowchart of FIG. 6. Then, the characteristic function CHAR assigned a null set "nil" as indicated by a function block 44. In addition, the next characteristic function, NXCHAR, is assigned the set, ESP. The program then flows to a decision block to determine if the characteristic function is equal to the next characteristic function. If not, the program will flow along a "N" branch to set the program variable CHAR to NXCHAR and then to set the program variable NXCHAR to be BAR(CHAR). The program then flows back to the input of decision block 46. The program keeps looping until CHAR and NXCHAR have the same value which is certain to happen. When the program exits from block 46 along the "Y" branch, then ASP is set to the value of NXCHAR.

It can be determined that a state-pair p is in the set $BAR^n$(ESP) if there is some sequence, SEQ of n many input vectors such that if SEQ is applied to the pair of designs in state p then the pair of designs will cycle into a state pair in ESP. Therefore, it is important to calculate the ESP first to know if the designs have any pair of equivalent states and second, to determine what state pairs can be cycled into ESP with some appropriate input sequence.

Universal Aligning Sequence (SEQ)

If p is a state pair in ASP, then there exists some sequence of input vectors, which we will call align(p), that will transform p into some state pair in equivalent-state-pairs. Of course, there may be a different sequence for each p. As will be described hereinbelow, if every state pair is in ASP, then there is some sequence of input vectors, independent of p, that will align every pair of states. This is referred to as a universal aligning sequence (USEQ).

Referring to FIG. 8, there is illustrated a graph of the states of $D_0$ and $D_1$, illustrating a plurality of sets. The sets are labeled $A_0$ through $A_n$. The set $A_0$ represents the ESP. The other sets represent $A_i$ with i ranging from 1 through n. Each $A_{i+1}$ represents $BAR(A_i)$ which was described above with respect to equation 7. Furthermore, the set $A_1$ represents all the state pairs that can be forced into ESP in a single clock cycle, and $A_2$ is the state pairs that can be forced into ESP in two or fewer dock cycles, and so forth. If the two designs are equivalent, then all state pairs will be in ASP. Furthermore, given a pair of states that is not in ESP, the universal aligning sequence will provide a sequence of inputs that will drive that pair into the ESP (that is, $A_0$).

A function, BAT(Q,i) is defined for calculating a Universal Aligning Sequence, USEQ. Let i be the least index greater than zero such that there is some state pair which is in Q and in $A_i$. The function BAT(Q,i) is defined as follows:

BAT(Q, i) = one-of{ins;
(∃ qs∈Q)(∃ nxqs∈$A_{i-1}$)transition(qs, ins, nxqs)}     (8)

The function BAT provides an input ins having the following property. There is some state pair p in Q that is forced from $A_i$ into $A_{i-1}$ when the input ins is applied to the pair of designs and the pair of designs is clocked one cycle. This function BAT provides an input vector which would drive some state of Q into the next inner set. Recall that ASP is assumed to the set of all state pairs. Starting with Q set to the set of all state pairs the index i which is greater than 0, is found. The input vector $SEQ_0$ which is BAT(Q, i) is found, and program variable Q is reassigned to (the image of Q with input $SEQ_0$) minus ESP. The process is repeated with the new value of Q which represents all state pairs that have not be aligned yet. Another input vector $SEQ_1$ is found. Eventually, Q will be the empty set. The universal aligning sequence USEQ is the sequence $SEQ_0$, $SEQ_1$, $SEQ_2$, . . . .

Referring now to FIG. 9, there is illustrated a flowchart for determining a universal aligning sequence (it is not, in general, unique). First, the ESP must be determined, as indicated in the block 40 and must be determined to not be empty block 42. Then the ASP must be determined as indicated by the block 46, which represents the flowchart of FIG. 7. Block 46 also calculates the $A_i$ sets illustrated in FIG. 8. ASP must be the set of all state pairs in block 48. The program then flows to a block 52 in which SEQ is initialized to the null sequence and Q is initialized to the set of all state pairs. Then the program flows to block 54 in which i is set to the minimum value, j, greater than 1 such that Q and $A_j$ have some state pair in common. In block 54 input vector ins is set to BAT(Q,i) and Q is now assigned to the image of Q with respect to ins. In block 54 Q is then reassigned to Q minus ESP and SEQ is assigned to the concatenation of ins with SEQ. Then the program flows to the decision block 56 in which it is determined whether Q is the empty set of state pairs. If "Y" then USEQ is assigned the value of SEQ. If "N" then the program loops back to block 54. It is claimed that eventually Q must be the empty set of state pairs. It is further claimed that the program will exit with the program variable USEQ having a universal aligning sequence as value.

With further reference to FIG. 8, an example of how the Universal Aligning Sequence is determined will be described in accordance with the flowchart of FIG. 9. Initially, Q is the set of all state pairs. After each iteration of the loop represented by blocks 54 and 56, either the number i gets smaller or the number of elements in Q gets smaller. A single iteration of blocks 54 and 56 is described as follows. The portion of states that have not been forced into ESP is Q and is represented by region 58. Since the sets $A_i$ entirely fill up the set of all state pairs, we can find the smallest index i>0 so that there is a state pair p that is in Q and also $A_i$. In the illustration of FIG. 8, i is equal to 2. The next step is to determine an input vector ins that will drive some point of $A_2$ into $A_1$. The vector ins is found by applying the function BAT to the set Q and index i. The arrow 60 represents the transition from state pair p to the new state pair resulting from the application of input vector ins to p. The program variable Q is reassigned to the set of state pairs to which the state pairs of Q are forced by the application of input vector ins. Then Q is again reassigned to the value of Q minus ESP. In the present illustration this has no effect. However, the smallest index k such that Q has a point in common with $A_k$ is now i−1, that is one less than before. In the present illustration that k is now 1. So some state pair in the new value of Q is within one step of ESP rather than 2 steps. The program variable SEQ which represents the input sequence generated so far is then extended by appending the input vector ins onto the end. In the next iteration of blocks 54 and 56 of FIG. 9, Q will be driven by an input represented by arrow 64 to the set represented by boundary 66 that does intersect ESP. When Q is modified by subtracting off ESP the number of state pairs in Q becomes smaller. Therefore, eventually Q will contain no elements, in which case the program of FIG. 9 will exit at block 56.

A pair of designs, $D_0$ and $D_1$, is defined to be "strongly equivalent", that is, $D_0 \approx D_1$, if the alignable-state-pairs is the set of all pairs. Strong equivalence is a symmetric and transitive relation. If $A_0 \approx A_1$ then $A_1 \approx A_0$ and therefore the relation $\approx$ is symmetric. To show that the relation $\approx$ is transitive, we assume that $D_0 \approx D_1$ and $D_1 \approx D_2$. Under this premise, it is claimed that $D_0 \approx D_2$. Using the universal aligning sequence, we may assume that $SEQ_{01}$ universally drives every $D_0$-$D_1$ state pair into ESP($D_0$, $D_1$) and assume that $SEQ_{12}$ drives every $D_1$-$D_2$ state pair into ESP($D_1$, $D_2$). It is claimed that sequence $SEQ_{01}$ followed by $SEQ_{12}$ drives every $D_0$-$D_2$ state pair into ESP($D_0$, $D_2$).

It can also be noted that a design $D_0$ is "self-equivalent" if $D_0 \approx D_0$. A design is not self-equivalent if a pair of states existing therein cannot be driven into an equivalent-state-pair for any sequence of inputs. If a design is not self-equivalent, then there exists two states in a design such that no sequence of inputs will cause the two states to become equivalent. A non-serf-equivalent design would be isolated from all designs that would fall under the strong-equivalence definition described above. For example, if $D_0 \approx D_1$, then by symmetry, $D_1 \approx D_0$. By transitivity, $D_0 \approx D_0$. Therefore, it $D_0$ must be self-equivalent to be strongly equivalent to any design.

Resetability

A design $D_0$ is essentially resetable if $D_0$ is equivalent to $D_0$, i.e., it is equivalent to itself. It is claimed that a universal aligning sequence for an original-new design pair ($D_0$, $D_1$) is an essential reset sequence for the original design Do. Therefore, if the ASP of the design compared with itself is not all pairs of states of its design, then the design is definitely not resetable. If the ASP is the set of all pairs, then calculating the universal aligning sequence for the design compared with itself will provide an essential reset sequence.

Self Stabilization and Replacement

If the design D is self-equivalent, i.e., D is equivalent to itself, a universal aligning sequence for (D, D), i.e., an essential reset sequence for D, is used to calculate all of the Essential Reset States (ERS) of D as is shown below. The design is defined as being "self-stabilizing" if there is a number $N_0$ such that if design D is in any state $s_0$ and SEQ is any sequence of $N_0$ many input vectors, then applying SEQ to design D in state $s_0$ will drive D into an essential reset state. A design is stable if every state of the design is an essential reset state.

Therefore, a machine is self-stabilizing if it has the property that no matter what initial state it is in, that by sequencing the machine a sufficient number of clock cycles with any inputs, the machine will automatically fall into an essential reset state. Further, a self-stabilizing design $D_0$ has the property that if $D_0$ is equivalent to design $D_1$ (i.e., $D_{00} \approx D_1$), and $D_0$ replaces $D_1$ in the larger resetable design D2, then the new larger design will be equivalent ($\approx$) to $D_2$. It is claimed that every essentially resetable design is equivalent to some self stabilizing design. As will be described hereinbelow, a concept termed the "outer-envelope" (OE) is utilized to decide whether a design is self-stabilizing by determining whether the outer-envelope is a subset of the set of essential reset states. This will allow a decision to be made whether a design is suitable for replacing parts of larger designs. This is termed Replaceability.

Outer-Envelope

Let D be any sequential design. A set of states, S, is defined to be invariant under all inputs if the set of states reachable from S in one clock cycle with arbitrary inputs, is S itself. Let the predicate, $P(s_0, s_1)$, be true if and only if in some input vector, ins, there is a transition from state $s_0$ to state $s_1$. Further, if we define state $s_0$ as pointing to $s_1$ if and only if $P(s_0, s_1)$ is true, then, given any set of states, S, we let F(S) be the set of states pointed to by some state in S, i.e., $$F(S) = \{s'; (\exists s \in S) P(s, s')\} \qquad (9)$$

Let AS be the set of all states of a design and consider the sequence AS, F(AS), $F^2$(AS), ..., $F^i$(AS), .... It is claimed that AS $\supseteq$ F(AS) and for all i, $F^i$(AS) $\subseteq F^{i+1}$(AS). Therefore, for some $i_0$, $F^{i_0}$(AS) = $F^{i_0+1}$(AS). The outer-envelope (OE) is defined to be $F^{i_0}$(AS). It is claimed that the outer-envelope is not empty and that the outer-envelope is invariant under all inputs. If a design has input signals to hold the values in all of the storage elements for one clock cycle, then the outer-envelope will be the set of all states.

Essential Reset States

A reset state is any state of a machine having the property that there is a specific sequence of inputs that will drive any state to that state. Further, a reset sequence for a machine is a sequence of inputs such that if you give a machine in any state that sequence of inputs, it will always go to one particular state, and that state is called a reset state. Of course, there may be a number of different reset states, with each reset state having its own reset sequence. It is claimed that if state $r_0$ is a reset state and $r_0$ can be driven to state $r_1$ by some sequence of inputs, then $r_1$ is also a reset state. It is claimed that if $r_0$ is any reset state, then the set of reset states reachable from $r_0$ by cycling the machine with arbitrary input is the set of all reset states of the machine.

As described above, a Universal Aligning Sequence (USEQ), for any pair of machines ($D_0$, $D_1$) is an Essential Reset Sequence for each of $D_0$ and $D_1$. Once the Essential Reset Sequence is known for a machine, it is then necessary to determine the essential reset states of the machine. The following function is used to find the essential reset states follows:

$$\text{Image}(Q,I) = \{nxqs; (\exists qs \in Q)(\exists ins \in I) \text{transition}(qs, ins, nxqs) \qquad (10)$$

where Q is some set of states, I is some set of input vectors.

Furthermore, let function H be define as follows;

$$H(Q) = \{nxqs: (\exists nxqs' \in (Q \cup \text{Image } (Q, \text{all input vectors}))(nxqs \sim nxqs')\} \qquad (11)$$

In words, H(Q) is the set of all state equivalent to states of Q or equivalent to states reachable from the states of Q by clocking the machine one cycle with arbitrary input vectors.

Therefore, assume that a some set R of essential reset states (possibly only one) is given (the next paragraph shows how to derive R) then consider the following sequence of states: R,H(R),$H^2$(R), .... It is claimed that R $\subseteq$ H(R) $\subseteq$ $H^2$(R) $\subseteq$ .... Therefore the essential reset states (ERS) is the limit as n goes to infinity of $H^n$(R).

We now show how to derive the initial set R of essential reset states. Referring now to FIG. 10, a Universal Aligning Sequence (USEQ) is determined in block 68 with reference to FIG. 9. The program then sets a variable TEMP-SEQ equal to SEQ and a variable STATES to equal all states, as indicated by a function block 70. The program then flows to a decision block 72 to determine if TEMP-SEQ is an empty set. If so, then it would flow along a "Y" path and define a variable SOME-ERS to be equal to STATES. This provides the initial set of essential reset states R of the previous paragraph, which is the purpose of the program. However, if TEMP-SEQ is not an empty sequence, the program flows along an "N" path to a function block 74. In the function block 74, STATES is set equal to Image(-STATES,head(SEQ)) wherein head(SEQ) represents the first element (i.e., head) of the sequence. We then set TEMP-SEQ equal to the reminder or the tail of SEQ or tail(SEQ). The program then flows back to the input of decision block 72 and continues until the sequence has been exhausted and SOME-ERS or R is found.

It is claimed that SOME-ERS can be checked by the following procedure. Formulate the set of pairs R×R as follows:

$$R \times R = \{(qs_0, qs_1); qs_0 \in \text{SOME-ERS} \& qs_1 \in \text{SOME-ERS}\} \qquad (12)$$

Then SOME-ERS has been derived correctly if and only if R×R $\subseteq$ ESP.

In the program of FIG. 10, initially, the first input vector in SEQ is applied to all states and then the program determines to which states all those states go. Then, the next input vector in SEQ will be applied to the remainder of the set of states to determine where they will go. After all of the input vectors in SEQ are applied, the sequence will terminate at a set of states that are all equivalent to one another, i.e., essentially the same. If the set of states contains only one state then that state will be an actual reset state. This can be seen with reference to FIG. 11, wherein each set of states, corresponding to Image0, Image1, Image2 and ImageN, are computed until they reach a set of essential reset states, ImageN. One of the advantages of the system that is described in accordance with the present invention is that the data structure is represented as a OBDD, which OBDD represents all states. Therefore, it is not necessary to take each state and calculate its transition from one state to the next for a given sequence. Rather, it is possible to calculate all of the states with the use of the OBDD representation.

After computing the initial essential reset states, it is then necessary to compute all essential reset states. The program for computing this is illustrated in FIG. 12. The SOME-ERS is computed in function block 78, which was described above with respect to FIG. 10 for computing one or more essential reset states. As described above, in order to compute all of the essential reset states, you must know at least one of the essential reset states. The variable STATES is set equal to a null set, and the variable NEW-STATES is set equal to SOME-ERS. This is represented in function block 80. The program then flows to a decision block 82 to determine if NEW-STATES is equal to STATES. If so, then the set of essential reset states (ERS) will be equal to the NEW-STATES. For the first pass, this will not be true. In the first pass, the program would flow through decision block 82 along the "N" branch thereof to a function block 84. The program variable STATES is set equal to NEW-STATES and the NEW-STATES is set equal to the union of STATES itself and the Image of STATES under all inputs. In other words, all of the STATES that had been determined thus far in the program would be combined with all of the STATES that can be reached from those STATES in one clock cycle, which is the purpose of the Image Function, described with reference to the equation 10. Then NEW-STATES is further enlarged to include all states that are equivalent to some state in NEW-STATES. The program would then flow back to the input of decision block 82. The result is that the final set of NEW-STATES would be all of the essential reset states.

Outer-Envelope

The flowchart for calculation of the outer-envelope is illustrated in FIG. 13. Initially, as indicated by a block 86, a program variable N is initialized to 0, Q is set equal to the null set, and TEMP is set equal to the set of all states. The program then flows to a function block to determine if Q is equal to TEMP. If so, the program flows along the "Y" path and the Outer-Envelope is set to the value of Q and OEN is set to the value of N. If not, the program flows to the block 90 along the "N" barnch to set N to N+1, Q equal to TEMP, and TEMP to Image(Q, all input vectors). The program then flows back to the input of decision block 88. As described above, the outer-envelope is essentially the states that the system must automatically fall into when it is clocked with arbitrary inputs. Each iteration of the program eliminates states that to which no state can transition.

The outer-envelope is illustrated in FIG. 14, wherein the initial set of states is then entire rectangle representing all states. After one pass through the routine of FIG. 13, the set is reduced to the set that can be reached by one clock cycle, as represented the states enclosed by a boundary 92. The set of states outside of boundary 92 are those state to which no state can transition. On the next clock cycle, the set is further reduced and is represented by the set that can be reached from the set represented by boundary 92 to a set represented by a boundary 94. The set of states within boundary 92 but outside of boundary 94 is the set of states to which no state within boundary 92 can transition. This process will continue until the set of states cannot be further reduced. When the process terminates, every state within the innermost boundary is reachable from every other state after within the same boundary. As described above, a design D is self-stabilizing if the outer-envelope of D is a subset of the essential reset states of D. If the design is self-stabilizing, everything in the outer envelope is an essential reset state and, if the design is self-stabilizing, then it can safely replace any part to which it is equivalent. This is important because if a design is self-stabilizing then it will automatically fall into an essential reset state just by clocking the design OEN clock cycles. We claim that if $D_0 \approx D_1$ and $D_1$ is self-stabilizing and $D_1$ is exchanged for $D_0$ in a larger resetable design D to obtain a new design D', then $D \approx D'$.

Summary of Design Equivalence and Replaceability Decision Procedure

Figure 15:
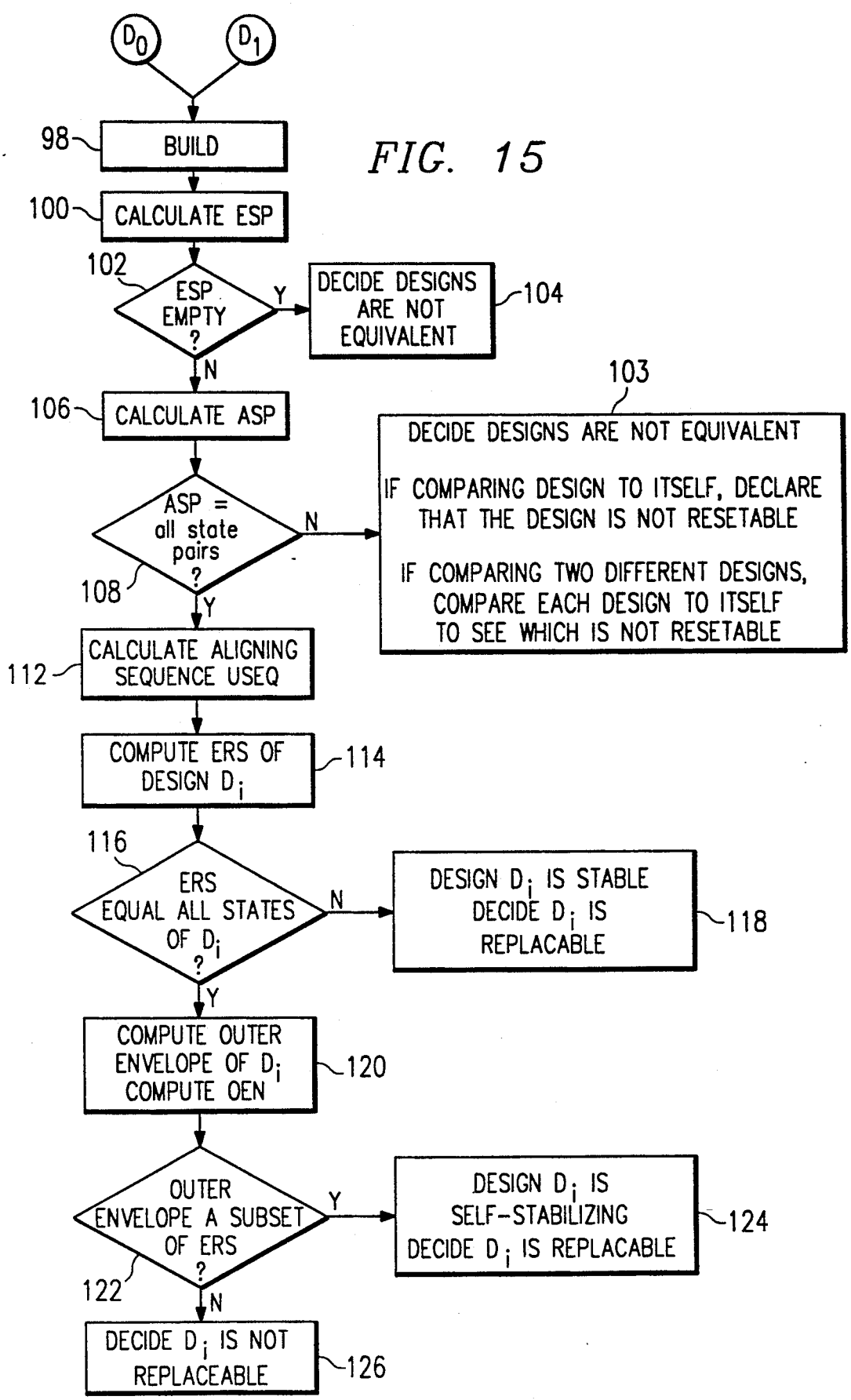
FIG. 15 illustrates an overall view of the overall sequence of operations in determining equivalence and replaceability.

Referring now to FIG. 15, there is illustrated a flowchart of the overall sequence of operations in determining equivalence and replaceability. Two compatible designs $D_0$ and $D_1$ are submitted to be compared as illustrated in FIG. 3. Each design is defined by a netlist and device models as described above. A one-to-one correspondence between the inputs of the two designs is submitted. Likewise a one-to-one correspondence between the outputs of the two designs is submitted.

In block 98 the following operations are performed. Boolean variables ins are instantiated for each of the design inputs, the same for both designs as described above. Boolean variables $qs_0$ and $qs_1$ representing the current states of the designs are instantiated for each of the design separately. The number of them may differ for the two designs. The combined collection of the $qs_0$ and $qs_1$ is called qs and they represent the current state of the design pair. Likewise, next-state variables $nxqs_0$ and $nxqs_1$ representing next-state variables of the two designs are instantiated. The combination of $nxqs_0$ and $nxqs_1$ is called nxqs and represents the next-states of the pair of designs. BDD representations are calculated for each storage element input and each design output of each design. The set equivalent output pairs (EOP) is calculated. A pair of states is in EOP if corresponding output functions are equivalent for each design. The transition relation is calculated for each design and the transition relation for the design pair is calculated to be the conjunction of the transition relations of the two designs.

The calculation flows to block 100 in which the equivalent state pairs (EOP) of the two designs is calculated as defined above and in FIG. 6, and as illustrated in FIGS. 4 and 5. The calculation then flows to block 102 in which it is decided whether the designs have any pair of equivalent states. If the answer is "no" the calculation flow through the branch into block 104 in which it is decided that the designs are not equivalent and therefore neither is a suitable replacement for the other. If the answer is "yes" the calculation flows through the "Y" branch into block 106 in which the alignable state pairs (ASP) of the two designs is calculated as defined above and in FIG. 7, and as illustrated in FIG. 8.

The calculation then flows into block 108 in which it is decided whether ASP is the set of all pairs of states of the two designs. If the answer is "no" then the calculation branches to block 110 in which it is declared that the two designs are not equivalent and therefore neither is a suitable replacement for the other. If the two designs- are identical we claim that the design is not resetable (or even essentially resetable). If the two designs are not identical, the calculation then branches back to the beginning (not shown here) in which it is determined which of the two designs (possibly both) is not resetable by comparing each design with itself. We claim that at least one of the two designs is not be resetable. If ASP is all state pairs, the calculation then branches to block 112.

In block 112 a universal aligning sequence (USEQ) is calculated for the design pair as defined above and in FIG. 9. We claim that a universal aligning sequence (USEQ) exists and that USEQ is an essential reset state of each of the designs. The calculation then flows to block 114. In block 114 the calculation defined in FIG. 10 and illustrated in FIG. 11 is carried out for at least one of the designs, say $D_1$. It is claimed that this calculation will produce a non-empty set SOME-ERS of essential reset states for $D_1$. It if further claimed that the calculation will demonstrate that USEQ is an essential reset sequence for $D_1$ as explained above. It is claimed that when the set SOME-RESET is used as the input to the calculation defined in FIG. 12 that the calculation produces the set of all essential reset states of $D_1$. The program then flow to decision block 116. If the set of essential reset states is the set of all states of $D_1$ then it is declared that $D_1$ is stable and it is claimed that $D_1$ may be substituted for any part (to which $D_1$ is equivalent) in any larger (essentially) resetable design without affecting the behavior of the larger design. If the ERS is not the set of all states of $D_1$ then the program flows to block 120.

In block 120 the outer envelope and OEN of design $D_1$ is calculated by the calculation defined above and in FIG. 13. The calculation is illustrated in FIG. 14. The calculation then flows to decision block 122 in which it is decided whether the outer envelope is a subset of the set of essentially resetable states (ERS) and the outer envelope number OEN. If the answer is "yes" then the calculation flows through the branch marked "Y" to block 124. In block 124 it is declared that $D_1$ is serf-stabilizing and that $D_1$ can safely replace any part (to which $D_1$ is equivalent) in any larger (essentially) resetable design as long as the larger design is clocked (with any inputs) OEN times when it is powered up and before its reset sequence is submitted. If the outer envelope is not a subset of ERS, then the design $D_1$ is declared to not be replaceable for a part to which $D_1$ is equivalent in at least one larger design.

Although the preferred embodiment has been described in detail, it should be understood that various changes, substitutions and alterations can be made therein without departing from the spirit and scope of the invention as defined by the appended claims. In the current implementation, all sets, predicates, and functions are represented by OBBDs and all operations performed on sets, predicates, and functions are accomplished with OBDDs.

APPENDIX

1 Equivalence Theory

1.1 Gate-Level Models and HFSMs

Synchronous designs are modeled at the gate level in terms of combinational elements and primitive storage elements. A primitive storage element (PSE) is a device that transports its input to its output on a clock event and holds the output value until the next clock event. An example of a primitive storage element is a simple D flip-flop (without enable or reset). Fortunately, most real storage devices, such as D flip-flops with enable, reset, and both Q and Q-bar outputs, can be modeled as a network of these primitive storage elements and combinational logic.

A gate-level model (GLM or design) is defined to be an interconnection of purely combinational elements and primitive storage devices. Each interconnection (.e., net) is required to have exactly one driver (design input or device output). A design may have no loops of purely combinational elements.

A state of a GLM is an assignment of boolean values (0 or 1) to the output of each primitive storage element of the design. Suppose a design (GLM), D, has i many outputs, n many PSEs, and o many outputs. Then design D has $2^n$ many states. For each state, each output is a boolean function of the inputs of D (if, for each state, each output function is a constant function, the design is called a Moore machine, otherwise it is called a Mealy machine). To account for quotient designs, which is define later on, the following notion is convenient.

Definition 1 A Hardware Finite State Machine (HFSM) is a quadruple, (Ins, States, Transition, Outputs) where Ins is a non-empty set of symbols, States is any non-empty set, Transition is a total function from $(\{0,1\}^{Ins} \times \text{States})$ into States, and Outputs is a n-tuple of functions ($n \geq 0$), each of which has domain $(\{0,1\}^{Ins} \times \text{States})$ and range $\{0,1\}$.

The transition function (see FIG. 1) may be thought of as a relation, Transition(qs, ins, nxqs), that is true if and only if the transition function has value nxqs when it receives inputs ins while at state qs. In other contexts, the transition function, transition(qs, ins), will be considered to be a function that produces a next state given an input vector and a current state. The context will make clear which notion of transition is being discussed. We will similarly abuse notation and write s0∈D {I couldn't tell if he just wanted an italic small "s" for this} when we mean that s0 is a state of design D. Note that these definitions do not mention initial states or accepting states as in classical finite state machine theory.

Two designs are defined to be compatible if they have the same set of inputs and outputs. The notion of hardware equivalence is defined only for compatible designs. Several notations that are useful in stating the theory are now defined.

Definition 2 Suppose s0∈D. Let SEQ be any sequence of n boolean input vectors. Define SEQ(s0) to be the state of design D following n machine cycles with inputs SEQ, starting from s0.

Definition 3 Given two input sequences SEQ0 and SEQ1, the input sequence, SEQ0++SEQ1, is defined to be the concatenation of SEQ0 and SEQ1, i.e., SEQ0++SEQ1 (S0)=SEQ0(SEQ1 (s0)).

Definition 4 A set of states, S, is closed under (all inputs means that if s ∈ S and ins is any input vector, then ins(s) ∈ S.

1.2 Equivalent States and the Quotient Design

Definition 5 Let s0 and s1 be states of compatible designs D0 and D1, respectively. State pair (s0, s1) is an Equivalent Output Pair (i.e., (s0, s1) ∈ EOP(D0, D1) if and only if for each pair of corresponding output functions, out0 of state s0 and out1 of state s1, out0=out1.

Definition 6 State s0 is defined to be equivalent (∼) to s1 if (s0, s1) ∈ EOP, and for any sequence SEQ of input vectors (SEQ(S0), SEQ(s1)) ∈ EOP. Let ESP (D0, D1) denote the set of equivalent state pairs of D0 and D1.

Therefore s0∼s1 if and only if the input/output behaviors of D0 starting in initial state s0 is the same as that of D1 starting in initial state s1. Clearly∼is an equivalence relation among states of compatible designs. For each HFSM, D, we define F to be the Signature Function of D as follows. For each state, state, F(state) is the function that maps an infinite sequence of inputs to the infinite sequence of outputs generated by D starting in state. By a minor abuse of notation, let D denote both a design and its signature function. It is easy to see that s0∼s1 if and only if D0(s0)=D1(s1). If SEQ is a finite sequence of input vectors, let (∂D/∂SEQ)(state)=D(SEQ(state)).

Given a state s of design D, the set of states of D that are equivalent to s is denoted [s], As usual the set if [s]'s are a partition of the states of D.

Definition 7 Let D be an HFSM (Ins, States, Transition, Outs). The quotient machine (D/~) of design D, is an HFSM (Ins', States', Transition', Outs') that satisfies the following relationships to D.

1. Ins' = Ins.
2. States' is the set of equivalence classes of (D/~).
3. Transition' ([qs], ins, [nxqs]) holds if and only if Transition (1s, ins, nxqs).
4. For each output $Out_i$ of D, the output of $Out_i'$ of (D/~) is such that $Out_i'$ (ins, [s]) = $Out_i$ (ins, s).

The proof that this definition makes sense, is based upon the observation that if two states are equivalent, they have the same output functions, and for any input vector their successor states are equivalent. The quotient machine is often called the state minimal or reduced machine. The following lemmas concerning the relationship between a design and its quotient are easy to prove.

Lemma 1 For each state, s, of design, D, s~[s].

Lemma 2 For any sequence, SXEQ, of input vectors, and for any state, s0, of design D, SEQ(s0)~[SEQ(s0)]~SEQ([s0]).

Lemma 3 States s0 and s1 are equivalent states of compatible designs D0 and D1, respectively, if and only if [s0] and [s1] are equivalent states of (D0/~) and (D1/~), respectively.

Lemma 4 For any design, D, the quotient, (D/~) has no two equivalent states that are different. Hence (D/~) is minimal.

1.3 Comparison of Symbolic Simulation

We digress to point out a quantitative relationship between symbolic simulation, as described in R. E. Bryant, "Can a Simulator Verify a Circuit?", Formal Aspects of VLSI Design, eds. G. J. Milne et al., North-Holland, 1986. and the present theory. For simplicity, we consider Moore machines only. Given a pair of states, say st-pair = (s0, s1), of design D0 and D1, suppose one simulates the pair of designs with (the same) symbolic inputs and compares their respective output functions. The symbolic output functions on the $n^{th}$ cycle is the same if and only if for any sequence of n boolean inputs, the outputs on cycle n are the same. If the symbolic output functions are not the same then one can deduce an institution of boolean inputs that will exhibit the non-equivalence of st-pair. However, how would one decide the equivalence of two initial states?

Theorem 1 Let $P_0$ be a pair of initial states of two compatible designs. There exists a number of cycles N, depending upon $P_0$ such that if each pair of corresponding outputs agrees (symbolically) for all cycles ≦N, then $P_0$ is an equivalent pair and, hence, the machines will produce the same outputs for all possible sequences of inputs of any length.

What is the number N? Consider the set of all pairs of states, p, reachable from $P_0$ by some sequence of inputs. For each such pair, p, let $n_p$ be the length of the shortest sequence of inputs to get from $P_0$ to p. The number N, is the maximum of all the numbers $n_p$. If the design is symbolically simulated for N cycles, every pair of states will be visited. Therefore, N is a sufficiently large number to guarantee correctness if the output functions agree for all sequences of N or fewer cycles of symbolic inputs. However, how does one calculate N in practice? We know of no convenient way to find an acceptable lower bound for N by analyzing the physical structure of the circuit (unless there are no feedback loops among PSEs).

However, with the transition relation one can find N as follows. For each i, let $A_0$ be the set containing only the initial state pair. Let $A_{i+1}$ be the union of $A_i$ and all states reachable from $A_i$ by one transition. The sequence, $A_0, A_1, \ldots$, is increasing and since the set of all state pairs is finite, for some i, $A_i = A_{i+1} = \ldots$. The number N is the least number, i, such that $A_i = A_{i+1}$.

This algorithm illustrates the general technique used to compute equivalent state pairs ESP and many other interesting predicates.

2.4 Alignability and Design Equivalence

Given that one cannot predict what state a design will be in when it is powered on, it is not enough to know that two designs have some pair of equivalent states. It must be possible to force the designs to behave the same no matter what their initial states are.

Definition 8 A pair of states p = (s0, s1) of a design pair (D0, D1) is alignable, if there is a sequence, $SEQ_p$ of inputs (called an aligning sequence) such that $SEQ_p(s0)$~$SEQ_p(s1)$, Let ASP(D0, D1) denote the set of all alignable state pairs.

An algorithm that computes ASP(D0, D1) is given in section 3.3. Notice that $SEQ_p$ aligns state pair p = (s0, s1) if and only if $(\partial D0/\partial SEQ_p)(s0) = (\partial D1/\partial SEQ_p)(s1)$. The notion of equivalence between compatible designs is now defined.

Definition 9 Two designs, D0 and D1, are equivalent (D0 ≈ D1) if and only if all state pairs are alignable (i.e., ASP(D0, D1) is the set of all pairs of states).

The following fundamental theorem shows that if every state pair is alignable with some aligning sequence (that may depend upon the pair), then there is an aligning sequence (that is pair independent) that aligns all state pairs.

Theorem 2 (fundamental alignment theorem) Designs D0 and D1 are equivalent if and only if there is an aligning sequence SEQ (called a universal aligning sequence) that aligns all state pairs, i.e., ($\forall s0 \epsilon D0, s1 \epsilon D1$) (($\partial D0/\partial SEQ)(s0) = (\partial D0/\partial SEQ)(s1)$).

Proof. The existence of a universal aligning sequence trivially implies design equivalence. To show that design equivalence implies the existence of a universal aligning sequence, observe that the set of equivalent state pairs is closed under all inputs. Let D0 and D1 be compatible HFSMs with state sets S0 and S1, respectively. Assume that D0 ≈ D1. Let F be any function such that if P is any non-empty subset of (S0 × S1) \ ESP then F(P) is an arbitrary but fixed input sequence SEQ such that for some state pair p0εP, we have that SEQ(p0)εESP. Let G(P) be (the image of set P under SEQ) minus ESP, i.e., SEQ(P) \ ESP. Since ESP is closed under all inputs, |G(P)| < |P|. Let P0 be (S0 × S1) \ ESP. Let N be the least number n such that $G^n(P_0o) = \{\}$. Then uSEQ aligns every pair of S × S1. QED.

It is encouraging that the intuitively appealing definition of hardware equivalence (≈) is a symmetric and transitive relation. However, we will see that it is not, in general, reflexive.

Theorem 3 The relation ≈ is symmetric and transitive.

Proof. Symmetry is obvious. To prove transitivity, assume that D0 ≈ D1 and D1 ≈ D2. Let SEQ0 be a universal aligning sequence for the pair (D0, D1) and SEQ1, for (D1, D2). Then ($\forall s0 \epsilon D0, s1 \epsilon D1$) (SEQ0(s0)~SEQ0(s1)) and so ($\forall s0 \epsilon D0, S1 \epsilon D1$)

(SEQ1(SEQ0(s0))~SEQ1(SEQ0(s1))). Since SEQ1 universally aligns D1 and D2, (∀s1∈D1, s2∈D2) (SEQ1(SEQ0(s0))~SEQ1(SEQ0(s2))). Therefore, SEQ1++SEQ0 universally aligns D0 and D1. QED An application of this theorem is the observation that if a design is equivalent to any other design then it must be equivalent to itself.

Corollary 1 If $A \approx B$, then $A \approx A$.

Actually the above corollary is also a consequence of the following theorem whose proof is trivial.

Theorem 4 Input sequence SEQ is a universal aligning sequence for D0 and D1 if and only if $(\forall x \in d0, y \in D0)((\partial D0/\partial SEQ)(x) = (\partial D1/\partial SEQ)(y))$. Furthermore, SEQ is a universal aligning sequence for the D compared with itself if and only if $(\partial D0/\partial SEQ)(x)$ (i.e., D0(SEQ(x))) is independent of state x.

The following theorem shows the necessity of the hypothesis that all state pairs are alignable in Theorem 2.

Theorem 5 There is a pair of machines having equivalent states such that no single aligning sequence will drive all alignable state pairs into the state of equivalent states.

For example, in FIG. 2 the implicit outputs are the binary representation of the state number. ASP (D0, D1) is {(0,3), (1,3), (3,3)} (which does not include state pair (2,3)) but no input sequence can align both (0,3) and (1,3). In fact, state pair (2,3) of design D0 alone is not alignable. Therefore, this example also shows that, in general, hardware equivalence ($\approx$) is not reflexive. The next section characterizes reflexivity.

1.5 Resetability

The notion of resetability is fundamental to understanding self-equivalent designs.

Definition 10 A state, s0, of a machine is a reset state if and only if there exists a sequence of inputs, SEQ, (called a reset sequence) such that if s is any state then SEQ(s)=s0. Let RS(D) be the set of reset states of D.

Theorem 6 Every state reachable from a reset state is a reset state. Therefore RS(D) is closed under all inputs.

Proof: Suppose SEQ0 is an input sequence that resets any state to the state s0. Suppose that state s1 is reachable from s0 by input sequence SEQ1. Then SEQ1++SEQ0 causes any state to go to state 1. QED

Theorem 7 Let D be any HFSM and let s0 be any reset state of design D. Then RS(D) is the set of states reachable pore s0.

Proof: Let s0 be any reset state. Let A be the set of states reachable from s0. By Theorem 6, A is a subset of RS(D). On the other hand if s1 is any reset state then s1 is reachable from any state, in particular, s0. Hence, RS(D) is a subset of A. QED Note that this theorem may be applied when D is the quotient of an HFSM. The notation S0×S1, denotes the set of ordered pairs of elements from sets S0 and S1.

Theorem 8 (Reset Theorem) Any design, D, is equivalent to itself (i.e., $D \approx D$) if and only if the quotient, $(D/\sim)$, is resetable. Furthermore, an input sequence, SEQ, aligns all pairs of D×D if and only if SEQ is a reset sequence for $(D/\sim)$ Proof: Assume that $D \approx D$ and let SEQ be a universal aligning sequence for the design pair (D, D). Let s0 be an arbitrary but fixed state of D. Claim: [SEQ(s0)] is a reset state of $(D/\sim)$. Let [s1] be any equivalence class of $(D/\sim)$. By hypothesis, SEQ(s1)~SEQ(s0). Hence SEQ([s1])=[SEQ(s1)]=[SEQ(s0)]. Therefore, $(D/\sim)$ is resetable.

Now assume that SEQ is a reset sequence for (D/18). Claim: SEQ is a universal aligning sequence for the design pair (D,D). Let (s0, s1) be any state pair of (D,D). By hypothesis, SEQ[s0]=SEQ[s1]. But then [SEQ(s0)]=[SEQ(s1)] and so SEQ(s0)~SEQ(s1). Hence D~D. In fact, SEQ(s)] is independent of s. QED

Definition 11 design is essentially resetable if $(D/\sim)$ is resetable.

Corollary 2 (to Corollary 1) If $A \approx B$, then A and B are essentially resetable.

Theorem 9 (Equivalence Theorem) The relation $\approx$ is an equivalence relation on the set of essentially resetable designs.

Proof By Theorem 8, $\approx$ is a reflexive relation of the set of essentially resetable designs. By Theorem 3, $\approx$ is symmetric and transitive. QED

1.6 The Isomorphism Theorem

Alternate characterizations of hardware equivalence are now proven.

Lemma 5 If resetable designs (HFSMs) D0 and D1 have any equivalent states then D0 and D1 have equivalent states that are reset states of each.

Proof: Assume s0∈D0 and s1∈D1 such that s0~s1, i.e. [s0]=[s1]. Let SEQ0 and SEQ1, be reset sequences for D0 and D1, respectively. By the definition of~, we have SEQ0(s0)~SEQ0(s1) and SEQ0(s0) ∈ RS(D0). Therefore, SEQ1++SEQ0(s0)~SEQ1++SEQ0(s1). But SEQ1++SEQ0(s0) ∈ RS(D0) by Theorem 6. And SEQ1++SEQ0(s1) ∈ RS(D1), by definition of reset sequence. QED The reader should observe that the lemma applies to all HFSMs, even quotients of HFSMs.

Lemma 6 Suppose essentially resetable design D0 and D1 have any equivalent states, then every state of $RS(D0/\sim)$ is equivalent to some state of $RS(D1/\sim)$.

Proof: Suppose D0 and D1 are essentially resetable designs with equivalent states s0 and s1. By Lemma 5, assume without loss of generality that [s0] and [s1] are reset states of $(D0/\sim)$ and $(D1/\sim)$, respectively. Let [s2] be any reset state of $(D0/\sim)$. Let SEQ be a reset sequence that forces every state of $(D0/\sim)$ to [s2]. Then SEQ[s0](which is [s2]) is equivalent to SEQ[s1], which is a reset state of $(D1/\sim)$(by Theorem 6). Therefore, [s2] is equivalent to some reset state of $(D1/\sim)$. Since [s2] was an arbitrary reset state of $(D0/\sim)$, the theorem follows. QED

Theorem 10 Suppose that compatible, essentially resetable designs D0 and D1 have some equivalent state pair. Then D0~D1. [In fact, if SEQ0 and SEQ1 are reset sequences for $(D0/\sim)$ and $(D1/\sim)$, respectively, then SEQ1++SEQ0 is a universal aligning sequence for the pair (D0, D1).]

Proof: Let D0 and D1 be essentially resetable and let SEQ0 and SEQ1 be reset sequences for $(D0/\sim)$ and $(D1/\sim)$, respectively. Let s0 and s1 be arbitrary states of D0 and D1, respectively. Claim: SEQ1++SEQ0([s0]) ∈ RS(D0/~). By Lemma 6, let [s2] be an element of RS(D1/~) be such that [s2]~SEQ0([s0]}. Note that SEQ1[s2] be an element of RS (D1/~), since SEQ1 is a reset sequence of (D1/~). Hence, SEQ1(SEQ0[s0])~SEQ1[s2]~SEQ1[SEQ0[s1]]. The claim easily follows. QED Two designs may fail to be equivalent in two ways. First they may have no pair of equivalent states. That means that for any pair of initial states there is some input sequence that will force at least one pair of corresponding outputs to differ. However, suppose that the two designs doe not have equivalent state pairs but that the designs are not equivalent. The above theorem shows that at least one of the designs does not have a reset state (even an essential reset state), i.e., at least one of the designs is not equivalent to itself.

A proposed reset sequence SEQ for a design D can be verified by (1) the methods described in O. Coudert, C. Berthet, J. C. Madre, "Verification of Sequential Machines Using Boolean Functional Vectors", Proceedings of the IMEC-IFIP International Workshop on Applied Formal Methods For Correct VLSI Design, Nov. 13-16, 1989 by deciding whether SEQ (all states) consists of a single state, or sometimes by (2) x-value simulation. Now suppose that each of two machines are shown to be resetable. Furthermore, suppose it can be determined by the methods of say, Coudert, Berthet, and Madre, that two specific initial states are equivalent. The following Corollary shows that the two machines are equivalent machines, in the sense presented in this paper. The proof follows from the trivial observation that a resetable design is essentially resetable.

Corollary 3 If compatible designs D0 and D1 are resetable and they have at least one pair of equivalent states, the D0~D1.

The notion of isomorphism for HFSMs is now defined. As usual, isomorphism just means that the two structures are identical up to renaming.

Definition 12 Suppose H1 (which is (I1, S1, T1, O1)) and (H2 (which is (I2, S2, T2, O2)) are two compatible HFSMs. A function, F, from S1 to S2 is an isomorphism if F is a bisection, and for all states, s0 and s1 in S1, and input vector, ins, T1(s0, ins, s1)) if and only if T2(F(s0), ins, F(s1)) and for each i, Out1$_i$(ins, s1)=Out2$_i$(ins, F(s1)).

It is easy to see that F is an isomorphism if and only if F is a bisection and F(s)~s. The following theorems characterize hardware equivalence ($\approx$) for the set of essentially resetable designs.

Theorem 11 Suppose D0 and D1 are essentially resetable deigns and that ESP(D0, D1)$\neq$\{\}. Then (RS9D0)/~) is isomorphic to (RS9D1)/~). Proof: Suppose essentially resetable designs, D0 and D1, have some pair of equivalent states. By Lemma 6, let F be a state-equivalence (~) preserving function from RS(D0/~) into RS(D1/~). Since no two states of a quotient design are ~, function F is one-to-one. Furthermore, Lemma 6 also shows that F is onto. Since s~F(s), F is an isomorphism. QED The following theorem summarizes the theorems of this section.

Theorem 12 (Isomorphism Theorem) Suppose that D0 and D1 are essentially resetable designs, then the following are equivalent:

1. D0~D1
2. There exists some equivalent state pair for D0 and D1
3. State equivalence (~) is an isomorphism from RS(D0/~) onto RS(D1/~)

Proof:

((1) implies (2)) This follows from the definition of equivalence.

((2) implies (3)) This follows from Theorem 11.

((3) implies (1)) Since D0 is essentially resetable, RS(D0/~) is not empty. By assumption (3), let [s0] and [s1] be elements of RS(D0/~) and RS(D1/~), respectively that are equivalent, i.e., s0~s1. By Theorem 10, D0$\approx$D1. QED From the point of view of the theory of sequential hardware equivalence presented here, the essence of a design is captured by the reset states of its quotient (modulo state equivalence), i.e., RS(D/~). For any essentially resetable design D0, any other design D1 is equivalent to D0 if and only if D1 is essentially resetable and the reset states of the quotient of D1 modulo~is isomorphic to RS(D0/~). In fact, RS(D/~) is the design with the fewest states that is equivalent to design D.

Theorem 13 For any essentially resemble design, D, the RS(D/~) is the minimal design that is equivalent to D.

2. Algorithms

Binary decision diagrams (BDDs), as described in R. E. Bryant, "Graph-Based Algorithms for Boolean Function Manipulation", IEEE Transactions on Computer, Vol. C35 No. 8, August 1986 are used to represent characteristic functions of sets of n-tuples of boolean values. Let E be a set and A$\subseteq$E. The characteristic function of a set A is the function $\chi_A$ such that $\chi_A(X)=1$, if x$\in$A, and $\chi_A(x)=0$, otherwise. Sets of n-tuples of boolean variables can, in turn, be thought of a as predicates of n variables. Logical operations "and", "or", and "not" are denoted by &, V, and $\neg$, respectively. Existential ($\exists$) and universal ($\forall$) quantification are defined for boolean variables as follows. Given a predicate $P(x_1, \ldots, x_i, \ldots, x_n)$, $(\exists x_i)P = (P(x_1, \ldots, 0, \ldots, x_n)$V$(P(x_1, \ldots, 1, \ldots, x_n))$ and $(\forall x_i)P = (P(x_1, \ldots, 0, \ldots, x_n)$&$(P(x_1, \ldots, 1, \ldots, x_n))$. Furthermore, $(\exists y_1 \ldots y_k)P = (\exists y_k) \ldots (\exists y_k)P$ and likewise for universal quantification. In this way, BDDs represent predicate calculus over boolean domains.

For example, suppose boolean values are assigned to the combined variables, qs, ins, and nxqs. Then transition (qs, ins, nxqs) has value TRUE if and only if the values assigned to nxqs are the next values of the primitive storage elements of the circuit when the current values are qs and the inputs are ins. The predicate qs-nxqs is true if and only if corresponding variables qs and nxqs have the same value. If G is a predicate involving variables qs, then the formula $(\exists qs)(F\&(qs=nxqs))$ is the same predicate in terms of variable nxqs, i.e., the formula changes variables. However, for simplicity, change of variables is implicit in the following algorithms. The programs below illustrate how to calculate the BDDs for the predicates Transition, Equivalent-Outputs, Equivalent-State-Pairs, Equivalent-Designs and an aligning sequence. Let $\Sigma$ and $\Pi$ represent iterated disjunction and conjunction, respectively.

2.1 Calculating Transition and Equivalent-Outputs

The transition predicate is derived as follows from a netlist for a design. For design $D_i$ let PSEs(i) be the set of storage elements. And let ins, qs$_i$, and nxqs$_i$ be the input, state, and next-state variables. For the input to each primitive storage element, q, the input to q is expressed as a boolean function, fun-q of variables, qs and ins. The function fun-q if derived directly from the netlist and logical device models.

$$\text{transition}_i(qs, ins, nxqs) = \prod_{q \in PSEs_i} (nxq = fun\text{-}q)$$

Then transition(ins, qs, nxqs) for a compatible pair $D_0$ and $D_1$ is just transition$_0$&transition$_1$.

Corresponding outputs, Out0$_i$ and Out1$_i$, of the two designs, are expressed as a function, Out0-fun$_i$(ins, qs0) and Out1-fun$_i$(ins, qs1) of the inputs and q-values. Let n be the number of outputs in two compatible designs. Equivalent-Output-Pairs (EOP) represents the set of state pairs (qs0, qs1) having the same output functions.

$$EOP(qs_0, qs_1) = (\forall ins) \prod_{i=1}^{n} (Out0_i(ins, qs_0) = Out1_i(ins, qs_1))$$

2.2 Calculating Equivalent-State-Pairs

Let function F be defined for any set of state-pairs Q as follows.

$$F(Q) = EOP.(\exists \, nxqs \in Q) \, (\forall \, ins) transition(ins, qs, nxqs)$$

Then F(all-pairs) is EOP. Furthermore, st-pair $\in F^n$(all-pairs) if an only if st-pair $\in$ EOP and all state pairs reachable from st-pair by a single input vector are in $F^{n-1}$(all pairs). Therefore, a simple induction argument establishes that for $n > 0$, st-pair $\in F^n$(all-pairs) if and only if st-pair $\in$ EOP and for any sequence SEQ of $n-1$ or fewer input vectors, SEQ(st-pair) $\in$ EOP. Hence $F^n$(all-pairs) $F^{n-1}$(all-pairs). Therefore, Equivalent-State-Pairs (ESP) is the largest fixed point of F, that is, ESP $= \lim_{n \to \infty} F^n$(all-pairs).

2.3 Calculations of Alignable-Pairs and Aligning Sequence

Let S be any set of state pairs and define $$G(S) = sV( \, nxqs \in S) \, (\exists \, ins) transition(qs, ins, nxqs)$$

Clearly, $G(S) \supseteq S$. Furthermore, st-pair $\in G^n$(ESP) if and only if there is some sequence SEQ of n many input vectors such as SEQ(st-pair) $\in$ ESP. Therefore alignable-state-pairs (ASP) is $\lim_{n \to \infty}$(ESP).

Recall that two designs are equivalent ($\approx$) if and only if ASP is all state pairs. Assume that $D0 \approx D1$. We now show how to compute a universal aligning sequence. Let align-ring$_0$ = ESP and for $n > 0$, let align-ring$_n$ to be $G^n(ESP) \setminus G^{n-1}(ESP)$. The algorithm employed closely follows the method of proof of Theorem 2. Let SEQ$_0$ = nil and unaligned$_0$ = st-pairs $\setminus$ ESP. Given SEQ$_k$ and unaligned$_k$, let N be least n such that unaligned$_k \cap$ align-ring$_N$. Let IN be an input vector such that IN(st-pair)$\in$align-ring$_{N-1}$. Let SEQ$_{k+1}$ = IN++SEQ$_k$ and unaligned$_{k+1}$ = IN(unaligned$_k$) $\setminus$ ESP. If $N > 1$ then the next N will be $N-1$. If $N = 1$, $|$unaligned$_{k+1}| < |$unaligned$_k|$. Therefore let K be such that unaligned$_K = \{\}$. Then SEQ$_K$ is a universal aligning sequence.

A universal aligning sequence can be checked by calculating the image of the set of all state pairs under the aligning sequence. The resulting set of states must be contained in equivalent-state-pairs.

3.0 Experimental Results

An important aspect of this theory of sequential hardware equivalence is that it is decidable. The algorithms of Section 3 are implemented in the MCC CAD Sequential Equivalence Tool (SET). SET is an ELK Scheme interpreter linked with a binary decision diagram program supplied by Carnegie Mellon University and Synopsys Inc. K. Brace, R. Rudell, R. Bryant, "Efficient Implementation of a BDD Package", Proceedings of the 27th ACM/IEEE Design Automation Conference, June 1990, pp. 40-45. To exercise SET, each of the KISS2 format Berkeley/MCNC small state machine benchmarks were synthesized with a commercial synthesis tool with binary and gray encodings. Amongst other things SET determines the following:

| | |
|---|---|
| trans | the transition relation |
| eo | equivalent-outputs |
| esp | equivalent-state-pairs |
| onto[0] | the set of states of design[0] equivalent to some state of design[1] |
| onto[1] | the set of states of design[1] equivalent to some state of design[0] |
| align dpth | the number of iterations required to find the set of alignable pairs |
| align pairs | the set of alignable state pairs an aligning sequence of input vectors for equivalent designs check of the validity of the aligning sequence |
| l-align seq | length of an aligning sequence |
| reset[0] | the set of reset states of design[0] |
| reset[1] | the set of reset states of design[1] |
| total | the number of seconds to calculate all of the above |

In tables 1-4, the number of dag nodes is given for each BDD representing a relation. A 0 indicates that a predicate is never true, a $-1$ indicates that the predicate is always true, and () indicates that eh property was not computed (because it is irrelevant). The ordering of variables is known to greatly influence the size of BDDs. We used a depth-first ordering based upon the structure of the circuit except for the examples of in which the variables were ordered by experimentation. Effective ordering of variables is an ongoing research topic.

An intuitively appealing definition of equivalence of gate level models (i.e., sequential designs) was formulated. A theory of equivalence was presented. A design is equivalent to itself if and only if its quotient is resetable. Essentially resetable designs are equivalent if and only if the set of reset states of their quotients are isomorphic. Essentially resetable designs are equivalent if and only if they have at least one pair of equivalent states. The computational feasibility of computing equivalence for small examples was established by the experimental results.

TABLE 1

| | Binary-Gray Comparison | | | | | | | | | | |
|---|---|---|---|---|---|---|---|---|---|---|---|
| name | trans | eo | esp | onto [0] | onto [1] | align dpth | alig prs | l-algn seq | reset [0] | reset [1] | *total |
| bbara | 161 | 11 | 26 | 4 | 3 | 2 | −1 | 3 | 4 | 3 | 3.97 |
| bbsse | 405 | 26 | 0 | 0 | 0 | 0 | 0 | 0 | 0 | 0 | 1.87 |
| bbtas | 65 | 5 | 17 | 3 | 3 | 3 | −1 | 3 | 3 | 3 | 3.64 |
| beecount | 94 | 5 | 0 | 0 | 0 | 0 | 0 | 0 | 0 | 0 | .65 |
| cse | 719 | 31 | 0 | 0 | 0 | 0 | 0 | 0 | 0 | 0 | 3.04 |
| dk14 | 150 | 20 | 19 | 3 | 3 | 2 | −1 | 2 | 3 | 3 | 2.71 |
| dk15 | 51 | 8 | 8 | −1 | −1 | 1 | −1 | 1 | −1 | −1 | 1.5 |
| dk16 | 436 | 74 | 81 | 7 | 7 | 3 | −1 | 7 | 7 | 7 | 13.74 |
| dk17 | 106 | 20 | 20 | −1 | −1 | 3 | −1 | 4 | −1 | −1 | 3.24 |

TABLE 1-continued

| | | | | Binary-Gray Comparison | | | | | | | |
|---|---|---|---|---|---|---|---|---|---|---|---|
| name | trans | eo | esp | onto [0] | onto [1] | align dpth | alig prs | l-algn seq | reset [0] | reset [1] | *total |
| dk27 | 57 | 15 | 19 | 3 | 3 | 3 | −1 | 4 | 3 | 3 | 3.27 |
| dk512 | 139 | 30 | 43 | 4 | 4 | 4 | −1 | 4 | 6 | 6 | 8.45 |
| donfile | 414 | −1 | −1 | 0 | 0 | 0 | 0 | 0 | 0 | 0 | 1.54 |
| ex1 | 836 | 75 | 0 | 0 | 0 | 0 | 0 | 0 | 0 | 0 | 5.97 |
| ex2 | 391 | 20 | 0 | 0 | 0 | 0 | 0 | 0 | 0 | 0 | 1.77 |
| ex3 | 167 | 10 | 0 | 0 | 0 | 0 | 0 | 0 | 0 | 0 | .74 |
| ex4 | 198 | 35 | 41 | 3 | 3 | 10 | −1 | 12 | 5 | 5 | 13.29 |
| ex5 | 206 | 18 | 0 | 0 | 0 | 0 | 0 | 0 | 0 | 0 | .88 |
| ex6 | 221 | 19 | 19 | 3 | 3 | 1 | −1 | 3 | 3 | 3 | 3.45 |
| ex7 | 191 | 18 | 0 | 0 | 0 | 0 | 0 | 0 | 0 | 0 | .8 |
| keyb | 1245 | 59 | 0 | 0 | 0 | 0 | 0 | 0 | 0 | 0 | 6.13 |
| kirkman | 118 | 24 | 0 | 0 | 0 | 0 | 0 | 0 | 0 | 0 | 4.57 |
| lion | 40 | 6 | 0 | 0 | 0 | 0 | 0 | 0 | 0 | 0 | .35 |
| lion9 | 98 | 11 | 0 | 0 | 0 | 0 | 0 | 0 | 0 | 0 | .41 |
| mark1 | 200 | 19 | 0 | 0 | 0 | 0 | 0 | 0 | 0 | 0 | .97 |
| mc | 52 | 8 | 8 | −1 | −1 | 3 | −1 | 4 | −1 | −1 | 1.86 |
| modulo12 | 78 | −1 | −1 | 0 | 0 | 0 | 0 | 0 | 0 | 0 | .26 |
| opus | 299 | 38 | 36 | 6 | 4 | 1 | −1 | 1 | 6 | 4 | 3.7 |
| planet | 1958 | 122 | 0 | 0 | 0 | 0 | 0 | 0 | 0 | 0 | 19.88 |
| planet1 | 1958 | 122 | 0 | 0 | 0 | 0 | 0 | 0 | 0 | 0 | 19.98 |
| sl | 4103 | 73 | 67 | 3 | 3 | 3 | −1 | 5 | 3 | 3 | 49.18 |
| sla | 4549 | −1 | −1 | 0 | 0 | 0 | 0 | 0 | 0 | 0 | 7.27 |
| s8 | 271 | −1 | −1 | 0 | 0 | 0 | 0 | 0 | 0 | 0 | .35 |

TABLE 2

| | | | | Binary-Gray Comparison | | | | | | | |
|---|---|---|---|---|---|---|---|---|---|---|---|
| name | trans | eo | esp | onto [0] | onto [1] | align dpth | alig prs | l-algn seq | reset [0] | reset [1] | *total |
| sand | 8472 | 48 | 0 | 0 | 0 | 0 | 0 | 0 | 0 | 0 | 64.2 |
| s-scf | 18491 | 243 | 0 | 0 | 0 | 0 | 0 | 0 | 0 | 0 | 50.36 |
| shiftreg | 53 | 6 | 20 | −1 | −1 | 3 | −1 | 3 | −1 | −1 | 2.07 |
| sse | 405 | 26 | 0 | 0 | 0 | 0 | 0 | 0 | 0 | 0 | 1.96 |
| styr | 1812 | 54 | 0 | 0 | 0 | 0 | 0 | 0 | 0 | 0 | 9.72 |
| tav | 15 | 4 | 8 | −1 | −1 | 0 | 8 | 0 | 0 | 0 | .42 |
| tbk | 1209 | 83 | 83 | −1 | −1 | 1 | −1 | 1 | −1 | −1 | 10.04 |
| train11 | 185 | 14 | 0 | 0 | 0 | 0 | 0 | 0 | 0 | 0 | .8 |
| train4 | 25 | 3 | 8 | −1 | −1 | 1 | −1 | 1 | −1 | −1 | 1.06 |

TABLE 3

| | | | | Binary-Self Comparison | | | | | | |
|---|---|---|---|---|---|---|---|---|---|---|
| name | trans | eo | esp | onto [0] | onto [1] | align dpth | alig prs | l-algn seq | reset [0] | *total |
| bbara | 154 | 11 | 31 | −1 | −1 | 2 | −1 | 2 | 4 | 3.21 |
| bbsse | 441 | 43 | 44 | −1 | −1 | 2 | −1 | 2 | 6 | 6.27 |
| bbtas | 64 | 4 | 19 | −1 | −1 | 3 | −1 | 3 | 3 | 3.57 |
| beecount | 103 | 13 | 20 | −1 | −1 | 1 | −1 | 1 | −1 | 1.96 |
| cse | 712 | 42 | 44 | −1 | −1 | 1 | −1 | 1 | −1 | 7.2 |
| dk14 | 152 | 20 | 20 | −1 | −1 | 2 | −1 | 2 | 3 | 2.48 |
| dk15 | 50 | 8 | 8 | −1 | −1 | 1 | −1 | 1 | −1 | 1.43 |
| dk16 | 444 | 78 | 92 | −1 | −1 | 4 | −1 | 6 | 7 | 13.77 |
| dk17 | 102 | 20 | 20 | −1 | −1 | 3 | −1 | 3 | −1 | 2.62 |
| dk27 | 58 | 16 | 20 | −1 | −1 | 3 | −1 | 4 | 3 | 2.9 |
| dk512 | 140 | 30 | 44 | −1 | −1 | 4 | −1 | 4 | 6 | 8.68 |
| donfile | 405 | −1 | −1 | 0 | 0 | 0 | 0 | 0 | 0 | 1.6 |

TABLE 4

| | | | | Binary-Self Comparison | | | | | | |
|---|---|---|---|---|---|---|---|---|---|---|
| name | trans | eo | esp | onto [0] | onto [1] | align dpth | alig prs | l-algn seq | reset [0] | *total |
| ex1 | 890 | 88 | 89 | −1 | −1 | 3 | −1 | 4 | 6 | 15.59 |
| ex2 | 403 | 31 | 92 | −1 | −1 | 2 | −1 | 2 | 4 | 8.19 |
| ex3 | 168 | 28 | 44 | −1 | −1 | 2 | −1 | 3 | 3 | 4.53 |
| ex4 | 197 | 41 | 44 | −1 | −1 | 10 | −1 | 12 | 5 | 14.66 |
| ex5 | 212 | 15 | 42 | −1 | −1 | 3 | −1 | 5 | 5 | 6.01 |
| ex6 | 236 | 20 | 20 | −1 | −1 | 1 | −1 | 4 | 3 | 4.07 |
| ex7 | 213 | 27 | 44 | −1 | −1 | 2 | −1 | 4 | 6 | 5.93 |
| keyb | 1178 | 59 | 88 | −1 | −1 | 2 | −1 | 2 | 7 | 14.5 |
| kirkman | 100 | 41 | 44 | −1 | −1 | 1 | −1 | 1 | −1 | 7.16 |
| lion | 35 | 6 | 8 | −1 | −1 | 2 | −1 | 2 | −1 | 1.49 |
| lion9 | 112 | 30 | 36 | −1 | −1 | 2 | −1 | 2 | −1 | 2.96 |

TABLE 4-continued

| | | | | Binary-Self Comparison | | | | | | |
|---|---|---|---|---|---|---|---|---|---|---|
| name | trans | eo | esp | onto [0] | onto [1] | align dpth | alig prs | l-algn seq | reset [0] | *total |
| mark1 | 201 | 37 | 44 | −1 | −1 | 1 | −1 | 1 | 5 | 4.62 |
| mc | 53 | 8 | 8 | −1 | −1 | 3 | −1 | 4 | −1 | 1.98 |
| modulo12 | 51 | −1 | −1 | 0 | 0 | 0 | 0 | 0 | 0 | .22 |
| opus | 315 | 39 | 43 | −1 | −1 | 1 | −1 | 1 | 6 | 4.11 |
| planet | 2016 | 182 | 188 | −1 | −1 | 19 | −1 | 58 | 2 | 288.21 |
| planet1 | 2016 | 182 | 188 | −1 | −1 | 19 | −1 | 58 | 2 | 287.61 |
| sl | 4527 | 91 | 92 | −1 | −1 | 3 | −1 | 5 | 3 | 61.36 |
| sla | 3752 | −1 | −1 | 0 | 0 | 0 | 0 | 0 | 0 | 6.46 |
| s8 | 255 | −1 | −1 | 0 | 0 | 0 | 0 | 0 | 0 | .38 |
| sand | 8508 | 60 | 92 | −1 | −1 | 19 | −1 | 20 | −1 | 607.77 |
| scf | 18639 | 307 | 388 | −1 | −1 | 1 | −1 | 1 | 14 | 65.99 |
| shiftreg | 53 | 6 | 20 | −1 | −1 | 3 | −1 | 3 | −1 | 2.11 |
| sse | 441 | 43 | 44 | −1 | −1 | 2 | −1 | 2 | 6 | 6.44 |
| styr | 1845 | 89 | 92 | −1 | −1 | 3 | −1 | 4 | 4 | 36.82 |
| tav | 13 | 4 | 8 | −1 | −1 | 0 | 8 | 0 | 0 | .47 |
| tbk | 1210 | 65 | 65 | −1 | −1 | 1 | −1 | 1 | −1 | 10.69 |
| train11 | 176 | 17 | 36 | −1 | −1 | 2 | −1 | 4 | −1 | 4.51 |
| train4 | 25 | 4 | 8 | −1 | −1 | 1 | −1 | 1 | −1 | 1.08 |

What is claimed is:

1. A method for comparing two sequential hardware designs to determine they are equivalent, comprising the steps of:
   providing a first sequential hardware design;
   providing a second sequential hardware design compatible to the first hardware design, having the same number of inputs and the same number of outputs;
   comparing the first sequential hardware design to the second sequential hardware design as a design pair to provide a representation of the total sequential behavior of the design pair;
   determining the equivalent-state-pair set of state pairs in the design pair that, for any sequence of inputs to the design pair, will result in the outputs of the first and second sequential hardware designs being equivalent for all state pairs reached by the set of inputs within said sequence; and
   determining if any state pairs of the design pair are included in the equivalent-state-pair set and, if not, indicate that the first sequential hardware design is not equivalent to the second sequential hardware design.

2. The method of claim 1, wherein the first and second hardware designs are the same.

3. The method of claim 1, and further comprising the steps of:
   if the equivalent-state-pair set is not empty, determine as the alignable-pairs set, the set of state pairs that can be transformed into the equivalent-state-pair set in less than a predetermined number of cycles;
   determine if the state pairs in the alignable-pair set is equal to the set of all state pairs for the design pair; and
   declare the first and second sequential hardware designs in the design pair equivalent if the state pairs in the alignable-pairs set is equal to the set of all state pairs for the design pair.

4. The method of claim 3, and further comprising declaring that one of the first and second sequential hardware designs in the design pair is not essentially resemble if any of the state pairs in the design pair are not in the set of alignable pairs.

5. The method of claim 3, and further comprising the step of determining a sequence of inputs that will transform all state pairs in the design pair into the equivalent-state-pair set.

6. The method of claim 1, and further comprising providing a representation of the total sequential behavior of the first and second sequential hardware designs, which are utilized in the step of comparing.

7. The method of claim 1 wherein the step of comparing comprises:
   determining the transition relationship of the design pair; and
   determining the output function of each of the first and second sequential hardware designs in the design pair.

8. The method of claim 7 wherein the step of determining the transition relationship is operable to represent the transition relationship as a binary decision diagram.

9. A method for comparing sequential hardware designs, comprising the steps of:
   providing a first sequential hardware design;
   providing a second sequential hardware design compatible to the first hardware design, having the same number of inputs and the same number of outputs;
   comparing the first sequential hardware design to the second sequential hardware design as a design pair to provide a representation of the total sequential behavior of the design pair;
   determining the equivalent-state-pair set of state pairs in the design pair that, for any sequence of inputs to the design pair, will result in the outputs of the first and second sequential hardware design being equivalent for all state pairs reached by the set of inputs within said sequence;
   if the equivalent-state-pair set is not empty, determine as the alignable-pairs set, the set of state pairs that can be transformed into the equivalent-state-pair set in less than a predetermined number of cycles;
   determine if the state pairs in the alignable-pair set is equal to the set of all state pairs for the design pair; and
   declare the first and second ..sequential hardware designs in the design pair equivalent if the state pairs in the alignable-pairs set is equal to the set of all state pairs for the design pair.

10. The method of claim 9, wherein the first and second sequential hardware designs are the same.

11. The method of claim 9, and further comprising declaring that one of the first and second sequential hardware designs in the design pair is not essentially resemble if any of the state pairs in the design pair are not in the set of alignable pairs.

12. The method of claim 9, and further comprising the step of determining a sequence of inputs that will transform all state pairs in the design pair into the equivalent-state-pair set.

13. The method of claim 9, and further comprising providing a representation of the total sequential behavior of the first and second sequential hardware designs, which are utilized in the step of comparing.

14. The method of claim 9 wherein the step of comparing comprises:
   determining the transition relationship of the design pair; and
   determining the output function of each of the first and second sequential hardware designs in the design pair.

15. The method of claim 14 wherein the step of determining the transition relationship is operable to represent the transition relationship as a binary decision diagram.

* * * * *

UNITED STATES PATENT AND TRADEMARK OFFICE
CERTIFICATE OF CORRECTION

PATENT NO. : 5,331,568

DATED : July 19, 1994

INVENTOR(S) : Carl Pixley

It is certified that error appears in the above-indentified patent and that said Letters Patent is hereby corrected as shown below:

Column 3, line 67, replace "$D_0$and $D_1$" with --$D_0$ and $D_1$--.

Column 5, line 59, replace "AH" with --All--.

Column 6, line 60, replace "D" with --$D_0$--.

Column 7, the equation, replace "$s = 1$" with --$i = 1$--.

Column 8, line 61, replace "dock" with --clock--.

Column 10, line 37, replace "non-serf" with --non-self--.

Column 11, line 4, replace "$Do_0 \approx D_1$" with --$D_0 \approx D_1$--.

Column 14, line 42, insert --N-- following "branch".

Column 15, line 27, replace "serf" with --self--.

Column 17, line 12, replace "$out_i'$" with --$out_i'$--.

Column 17, line 44, replace "$n^{th}$" with --$n^{th}$--

UNITED STATES PATENT AND TRADEMARK OFFICE
CERTIFICATE OF CORRECTION

PATENT NO. : 5,331,568

DATED : July 19, 1994

INVENTOR(S) : Carl Pixley

It is certified that error appears in the above-indentified patent and that said Letters Patent is hereby corrected as shown below:

Column 17, line 54, replace "$\leq N$" with --$\leq N$--.

Column 17, line 60, replace "$n_p$" with --$n_\varrho$--.

Column 17, line 62, replace "$n_p$" with --$n_\varrho$--.

Column 18, line 57, replace "$G^n(P0o)$" with --$G^n(P0o)$--.

Column 19, line 12, replace "$\forall x \in d0$" with --$\forall x \in D0$--.

Column 19, line 48, replace "pore" with --from--.

Column 20, line 1, replace "(D/18x" with --(D/~--.

Column 20, line 11, replace "$\neq$" with --$\approx$--.

Column 21, line 23, replace "D0~D1" with --D0$\approx$D1--.

Column 21, line 27, replace "01" with --O1--.

Column 22, line 65, replace "$transition_0 \& transition_1$" with --$\underline{transition_0} \& \underline{transition_1}$--.

Column 23, line 23, insert --$\subset$-- following "pairs)", first occurrence.

UNITED STATES PATENT AND TRADEMARK OFFICE
CERTIFICATE OF CORRECTION

PATENT NO. : 5,331,568
DATED : July 19, 1994
INVENTOR(S) : Carl Pixley

It is certified that error appears in the above-indentified patent and that said Letters Patent is hereby corrected as shown below:

Column 28, Claim 9, line 63, delete ".." following "second".

Column 29, Claim 11, replace "resemble" with --resetable--.

Signed and Sealed this

Seventh Day of February, 1995

Attest:

BRUCE LEHMAN

Attesting Officer      Commissioner of Patents and Trademarks